United States Patent
Ohta et al.

(10) Patent No.: US 7,817,381 B2
(45) Date of Patent: Oct. 19, 2010

(54) THIN FILM MAGNETIC HEAD WHICH SUPPRESSES INFLOW OF MAGNETIC GENERATED BY BIAS-APPLYING LAYERS INTO A FREE LAYER FROM A LAYERING DIRECTION

(75) Inventors: Naoki Ohta, Tokyo (JP); Kosuke Tanaka, Tokyo (JP); Kazuki Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 764 days.

(21) Appl. No.: 11/798,744

(22) Filed: May 16, 2007

(65) Prior Publication Data
US 2008/0285178 A1    Nov. 20, 2008

(51) Int. Cl.
*G11B 5/33* (2006.01)
(52) U.S. Cl. .................................... 360/319
(58) Field of Classification Search ............. 360/319
See application file for complete search history.

(56) References Cited

U.S. PATENT DOCUMENTS 6,005,753 A * 12/1999 Fontana et al. ........... 360/324.2
6,563,679 B1    5/2003 Li et al.

FOREIGN PATENT DOCUMENTS

| JP | A 2002-123912 | 4/2002 |
| JP | A 2002-175611 | 6/2002 |
| JP | A 2004-319709 | 11/2004 |
| JP | A 2006-228326 | 8/2006 |

* cited by examiner

*Primary Examiner*—David D Davis
(74) *Attorney, Agent, or Firm*—Oliff & Berridge, PLC

(57) ABSTRACT

A thin film magnetic head comprises a lower magnetic shield layer and an upper magnetic shield layer which are mutually opposed in the layering direction, a magnetoresistance effect element having a free layer, and a bias-applying layer which applies a bias magnetic field to the magnetoresistance effect element. The free layer is positioned between the lower magnetic shield layer and the upper magnetic shield layer, and is positioned on the side of the media-opposed surface. The bias-applying layer has a first portion, a second portion, and a third portion. The first portion and the second portion are positioned at a distance in the track width direction so as to enclose the magnetoresistance effect element therebetween. The third portion is positioned either between the magnetoresistance effect element and the lower magnetic shield layer or between the magnetoresistance effect element and the upper magnetic shield layer, and connects the first portion and the second portion.

8 Claims, 22 Drawing Sheets

Fig.5
(a)
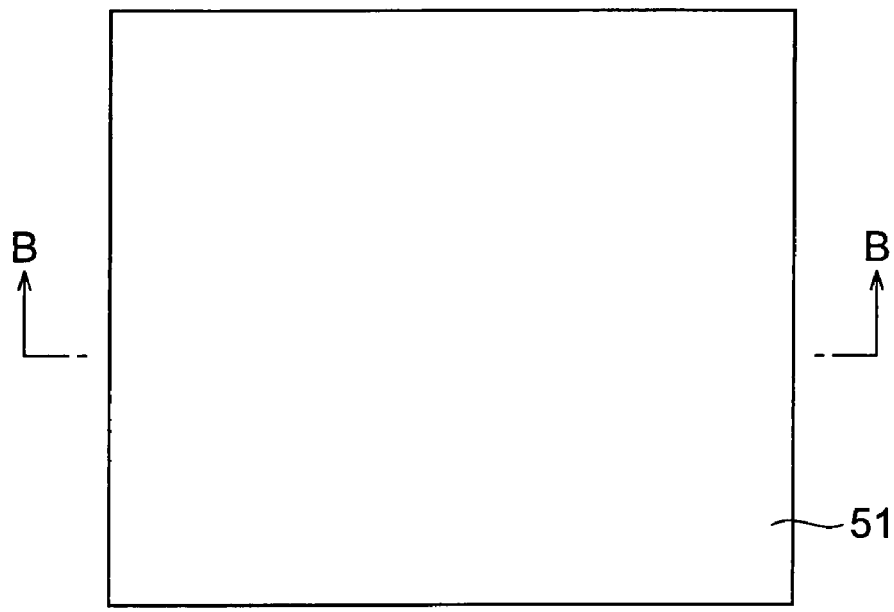
(b)
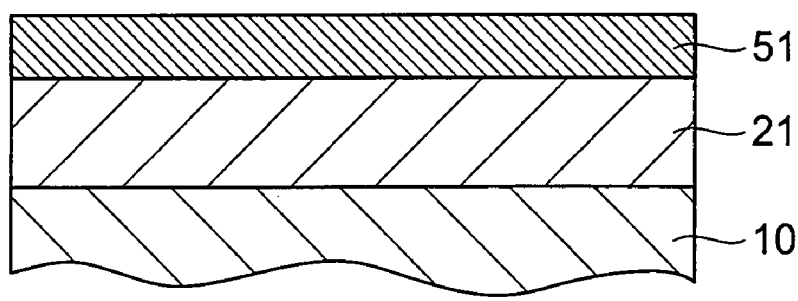

Fig.6
(a)
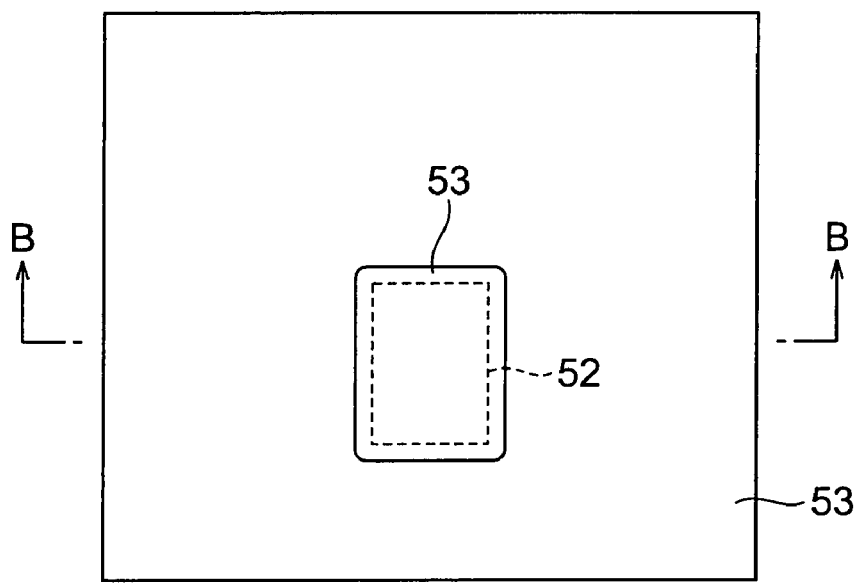
(b)
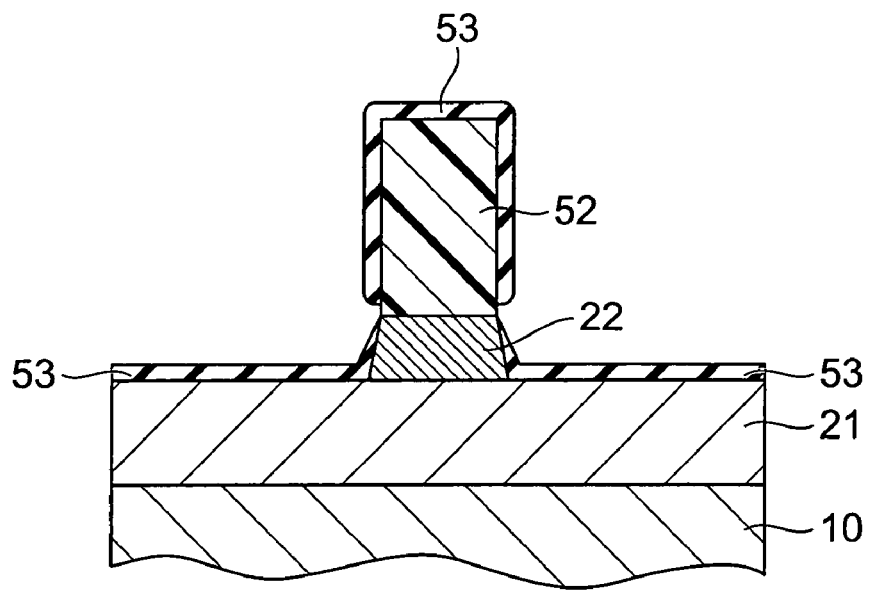

Fig.7
(a)
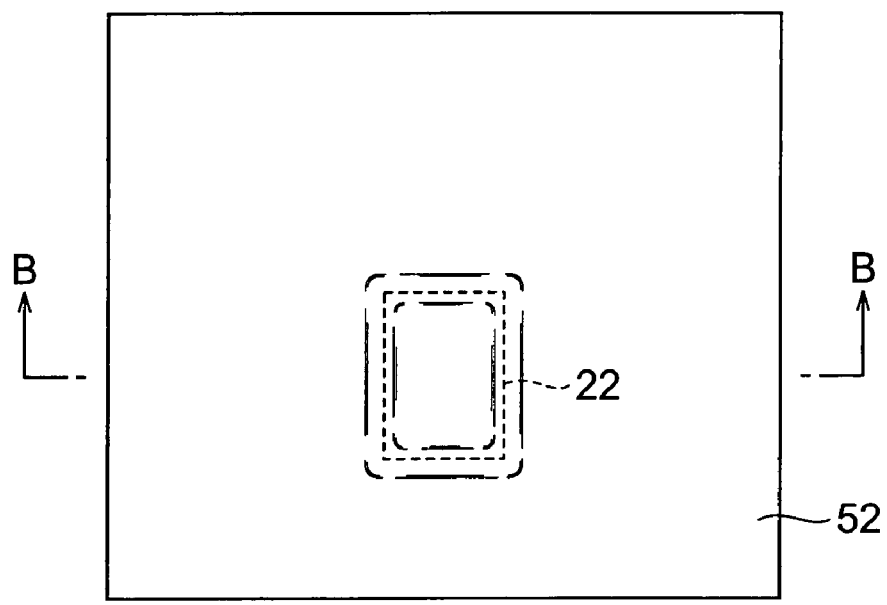
(b)
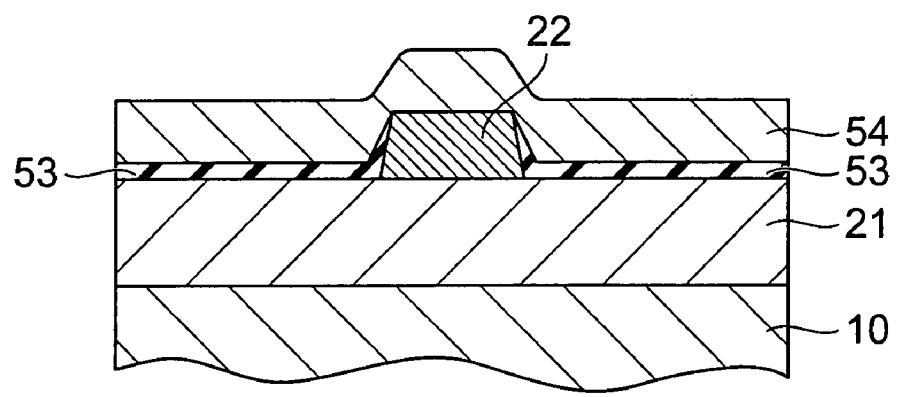

Fig.8
(a)
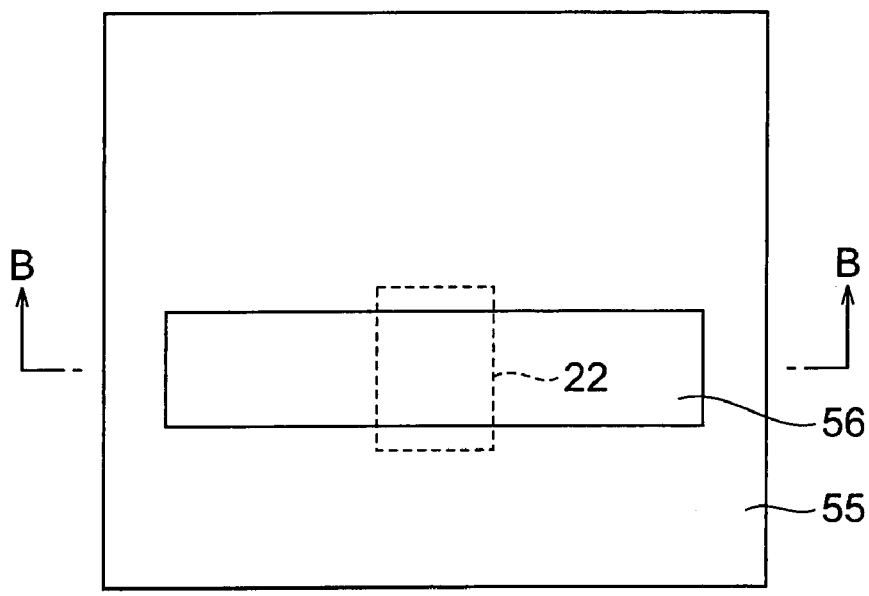
(b)
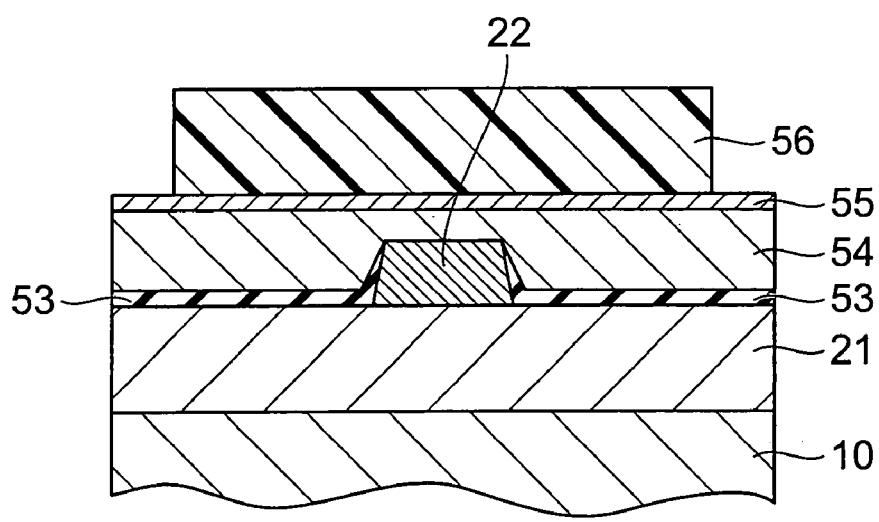

Fig.9
(a)
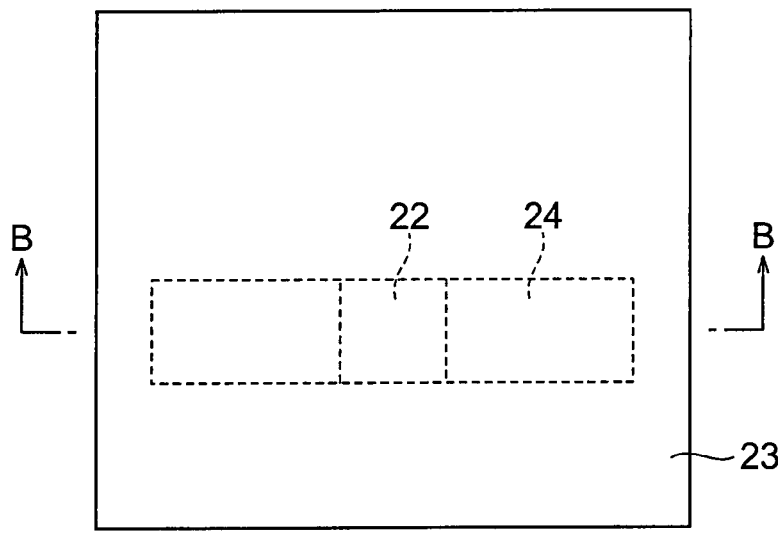
(b)
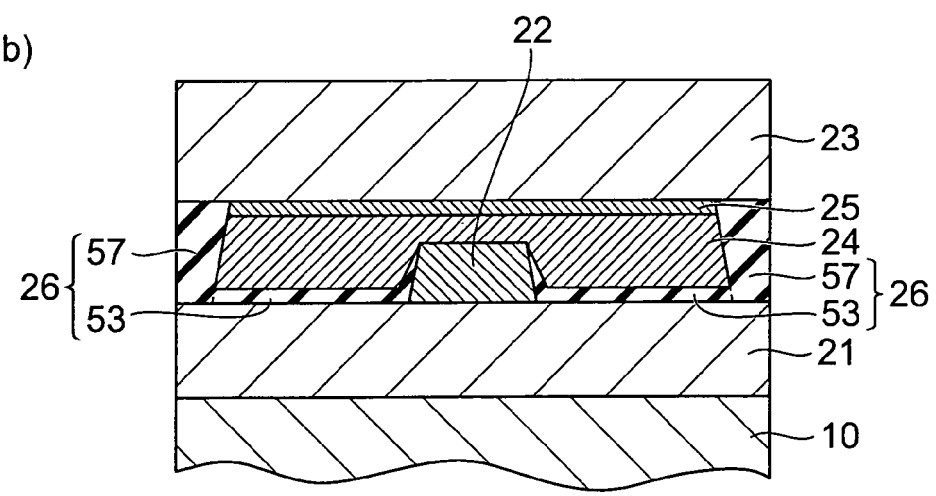

Fig.16
(a) 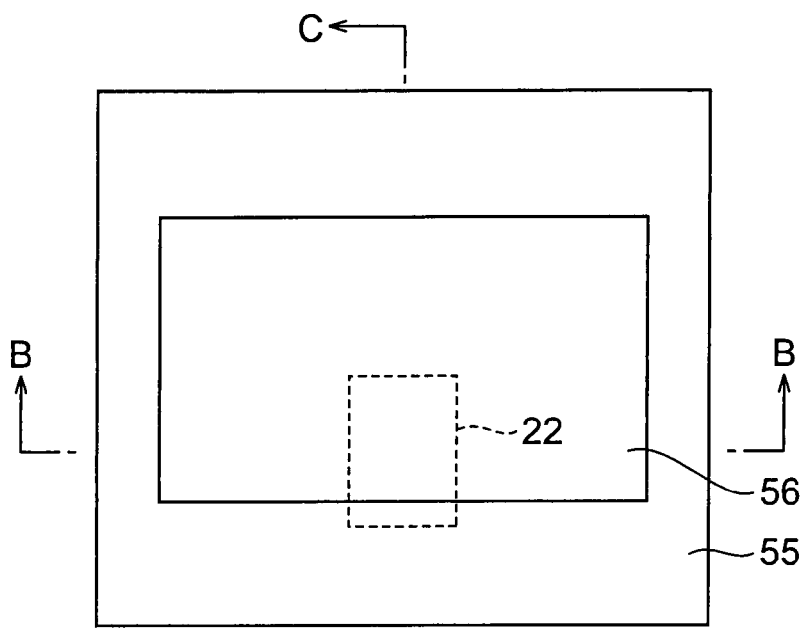
(b) 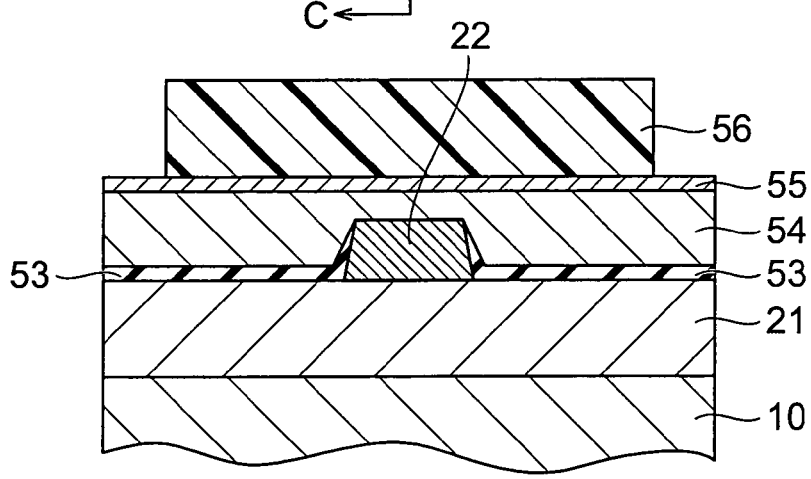
(c) 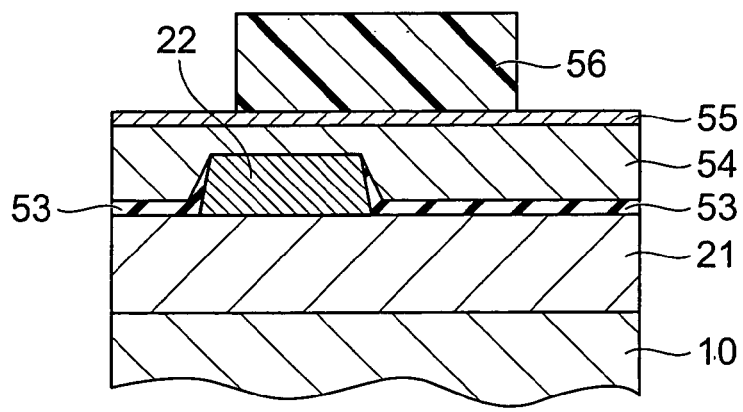

THIN FILM MAGNETIC HEAD WHICH SUPPRESSES INFLOW OF MAGNETIC GENERATED BY BIAS-APPLYING LAYERS INTO A FREE LAYER FROM A LAYERING DIRECTION

BACKGROUND OF THE INVENTION

1. Field of the Invention

This invention relates to a thin film magnetic head comprising a bias-applying layer.

2. Related Background Art

In the prior art, thin film magnetic heads have been known which comprise a magnetoresistance effect element and a pair of bias-applying layers which apply a bias magnetic field to the magnetoresistance effect element, and in which the pair of bias-applying layers are positioned with the magnetoresistance effect element therebetween and arranged in the track width direction (see for example Japanese Patent Laid-open No. 2002-123912).

SUMMARY OF THE INVENTION

However, in a thin film magnetic head of the prior art, for manufacturing reasons, the end faces at which the magnetoresistance effect element and the pair of bias-applying layers are opposed have always been formed at an inclination to the layering direction. Hence, in a thin film magnetic head of the prior art, magnetic flux in the bias magnetic field generated by the bias-applying layers has tended to flow into a free layer from the layering direction as well as from the direction of arrangement of the bias-applying layers (track width direction). In this case, of the free layer, magnetization occurs in the portion into which flux flows from the layering direction not only in the direction of arrangement of the bias-applying layers, but in the layering direction also, and so there are concerns that noise may be increased or that the asymmetry characteristic (output amplitude asymmetry) may be degraded.

An object of this invention is to provide a thin film magnetic head which enables suppression of inflow of magnetic flux generated by bias-applying layers into the free layer from the layering direction.

A thin film magnetic head of this invention is a thin film magnetic head having a media-opposed surface, and comprises a lower magnetic shield layer and an upper magnetic shield layer, mutually opposed in the layering direction; a magnetoresistance effect element, positioned between the lower magnetic shield layer and the upper magnetic shield layer and positioned on the side of the media-opposed surface, and having a free layer whose magnetization direction changes according to an external magnetic field; and a bias-applying layer which is positioned between the lower magnetic shield layer and the upper magnetic shield layer and which applies a bias magnetic field to the magnetoresistance effect element; the bias-applying layer has a first portion and a second portion arranged at a distance in the track width direction so as to enclose the magnetoresistance effect element, and a third portion which is placed at least either between the magnetoresistance effect element and the lower magnetic shield layer or between the magnetoresistance effect element and the upper magnetic shield layer, and which connects the first portion and the second portion.

In a thin film magnetic head of this invention, the bias-applying layer has the first through third portions, and the third portion, which is between the magnetoresistance effect element and the lower magnetic shield layer or between the magnetoresistance effect element and the upper magnetic shield layer, or both, connects the first portion and the second portion. Therefore, magnetic flux which tends to flow into the free layer from the layering direction when no third portion is present, passes through the third portion. As a result, the inflow of magnetic flux into the free layer from the layering direction can be suppressed.

It is preferable that the thickness in the layering direction of the third portion of the bias-applying layer be 2 nm or greater, and be smaller than ½ the straight-line distance in the layering direction between the lower magnetic shield layer and the upper magnetic shield layer, and moreover be smaller than the magnitude of the thickness, in the layering direction, of the first portion and the second portion, obtained by subtracting the straight-line distance in the layering direction between the free layer and the third portion, and the thickness in the layering direction of the free layer. If the thickness in the layering direction of the third portion of the bias-applying layer is less than 2 nm, then the residual magnetization approaches zero, and magnetic properties tend not to appear in the third portion, so that passage of magnetic flux through the third portion is impeded. If the thickness in the layering direction of the third portion of the bias-applying layer is equal to or greater than ½ the straight-line distance (that is, the read gap) in the layering direction between the lower magnetic shield layer and the upper magnetic shield layer, then the free layer can no longer be positioned in substantially the center of the read gap, and if the free layer is positioned at a position other than substantially the center of the read gap, then consequently the bias-applying layer is positioned closer toward either the lower magnetic shield layer or the upper magnetic shield layer, and as a result excess space occurs between the lower magnetic shield layer and the upper magnetic shield layer, and the thickness in the layering direction of the thin film magnetic head is increased. If the thickness in the layering direction of the third portion of the bias-applying layer is equal to or greater than the magnitude of the thickness in the layering direction of the first portion and the second portion, less the straight-line distance in the layering direction between the free layer and the third portion, and less the thickness in the layering direction of the free layer, then at least a portion of the free layer is positioned below the lower face of the first portion and the second portion, so that the bias magnetic field due to the bias-applying layer is not readily applied to the free layer.

It is preferable that the free layer be positioned on a virtual plane passing through substantially the center in the layering direction of the first portion and the second portion of the bias-applying layer. By this means, the bias magnetic field due to the bias-applying layer can easily be applied to the free layer.

Further, it is preferable that the free layer be positioned substantially in the center in the layering direction between the lower magnetic shield layer and the upper magnetic shield layer. If the free layer is positioned at a position other than substantially the center in the layering direction between the lower magnetic shield layer and the upper magnetic shield layer, then as a consequence the bias-applying layer is positioned closer to either the lower magnetic shield layer or to the upper magnetic shield layer, and as a result excess space occurs between the lower magnetic shield layer and upper magnetic shield layer, and the thickness in the layering direction of the thin film magnetic head is increased; but if positioned substantially in the center, the thickness in the layering direction of the thin film magnetic head can be kept small.

Further, it is preferable that the third portion be positioned both between the magnetoresistance effect element and the lower magnetic shield layer, and between the magnetoresistance effect element and the upper magnetic shield layer. By this means, both the inflow of magnetic flux arising from the bias-applying layer in the layering direction from the lower magnetic shield side into the free layer, and the inflow of magnetic flux arising from the bias-applying layer in the layering direction from the upper magnetic shield side into the free layer, can be suppressed.

Further, it is preferable that the bias-applying layer further have a fourth portion (see FIG. 14, described below), positioned on the side opposite the media-opposed surface from the magnetoresistance effect element, and connecting the first portion and second portion. In order to adjust the intensity of the bias magnetic field applied to the free layer, there are cases in which the width of the bias-applying layer in the depth direction relative to the media-opposed surface is made greater than the width of the magnetoresistance effect element in the depth direction relative to the media-opposed surface; in such cases, magnetic flux in the bias magnetic field arising due to the bias-applying layer tends to flow into the free layer not only in the direction of arrangement of the bias-applying layer (track width direction), but also from the depth direction relative to the media-opposed surface. However, as described above, the fourth portion connects the first portion and the second portion on the side opposite the media-opposed surface from the magnetoresistance effect element. Hence magnetic flux which tends to flow into the free layer from the depth direction relative to the media-opposed surface when the fourth portion is not present, flows through the fourth portion. As a result, the inflow of magnetic flux from the depth direction relative to the media-opposed surface into the free layer can be suppressed.

Further, it is preferable that a sense current flow in the magnetoresistance effect element, in the film thickness direction of the free layer.

Thus by means of this invention, a thin film magnetic head can be provided in which the inflow of magnetic flux arising due to a bias-applying layer, from the layering direction into the free layer, can be suppressed.

The present invention will be more fully understood from the detailed description given herein below and the accompanying drawings, which are given by way of illustration only, and thus are not to be considered as limiting the present invention.

Figure 10:
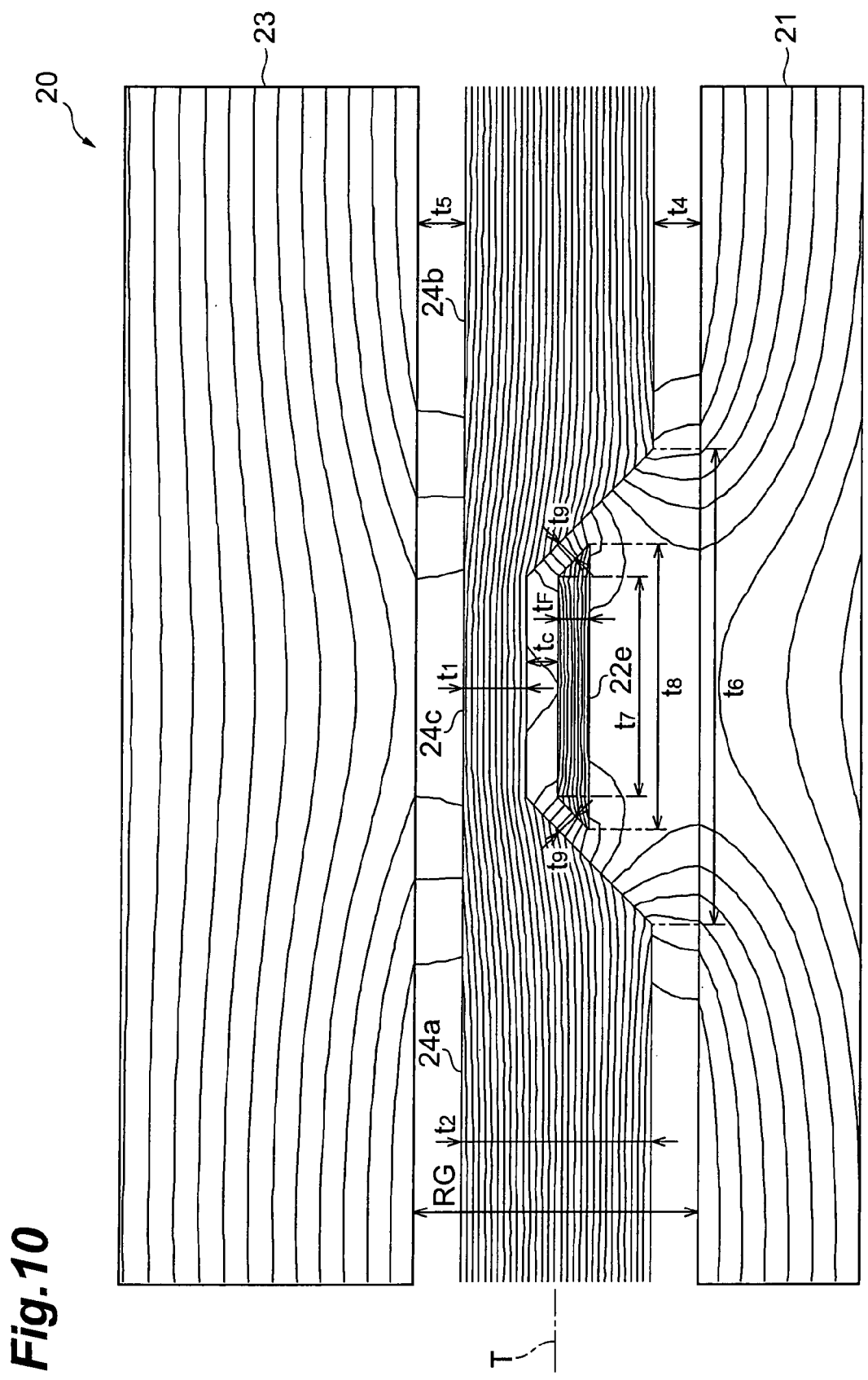
Figure 11:
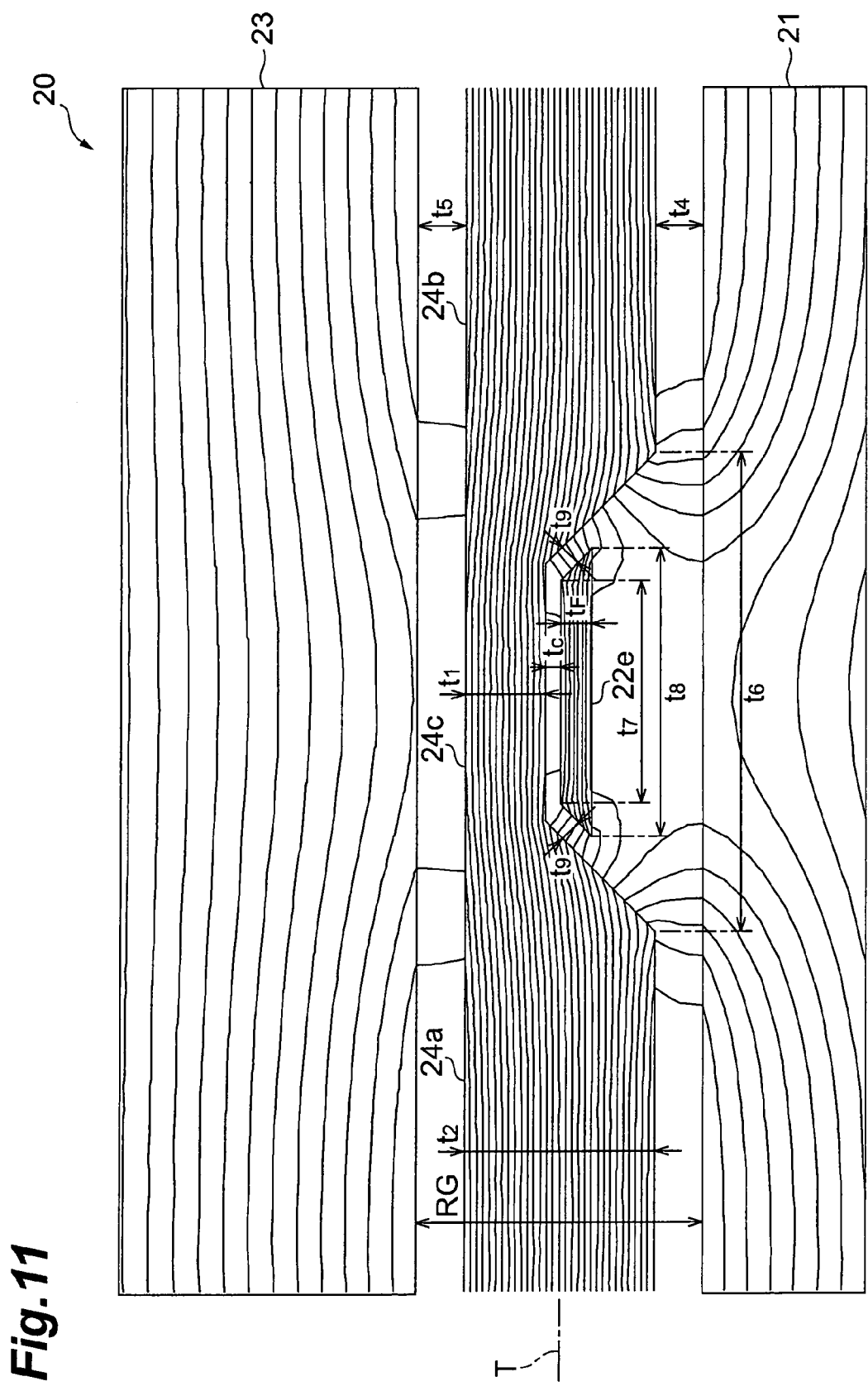
Figure 12:
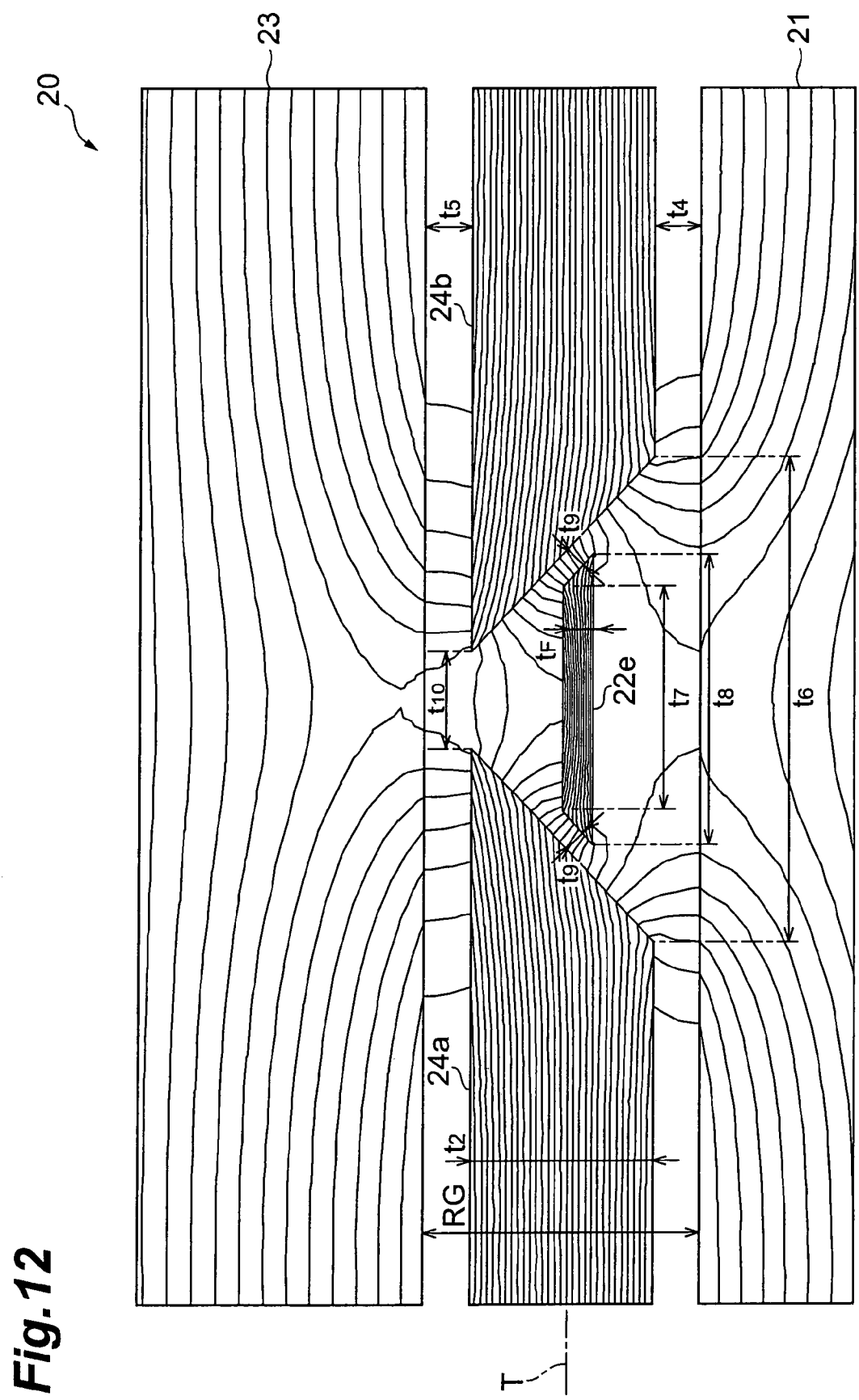
Figure 13:
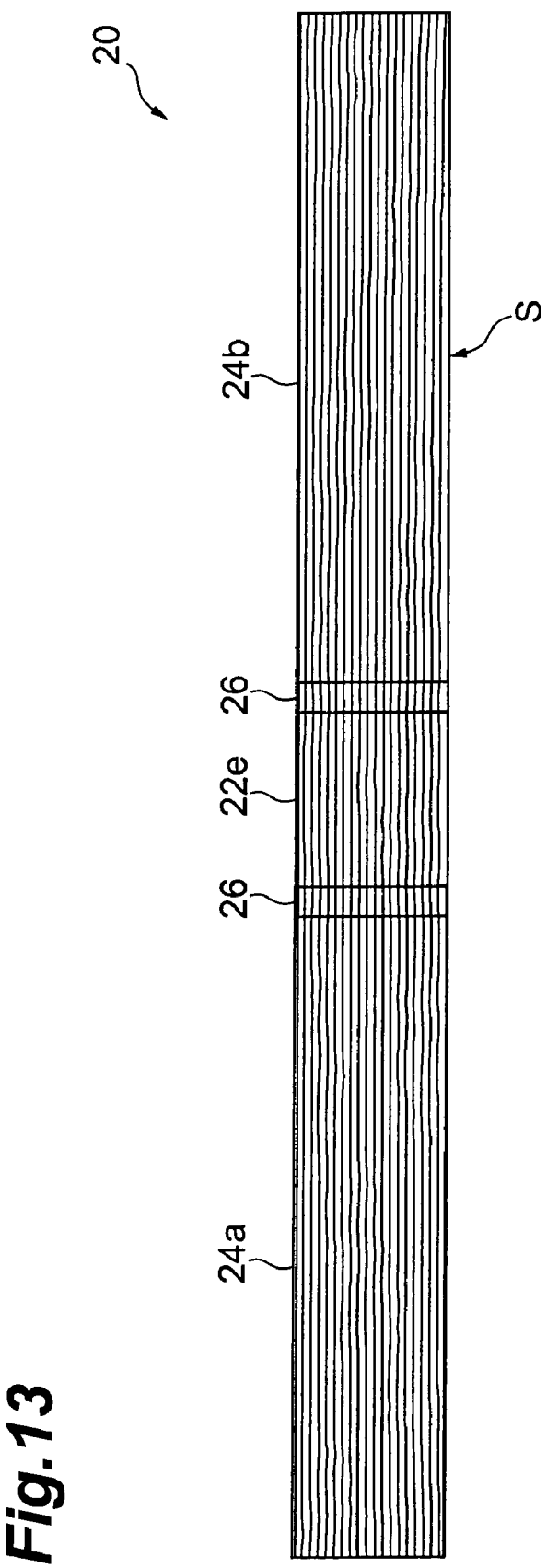
Figure 14:
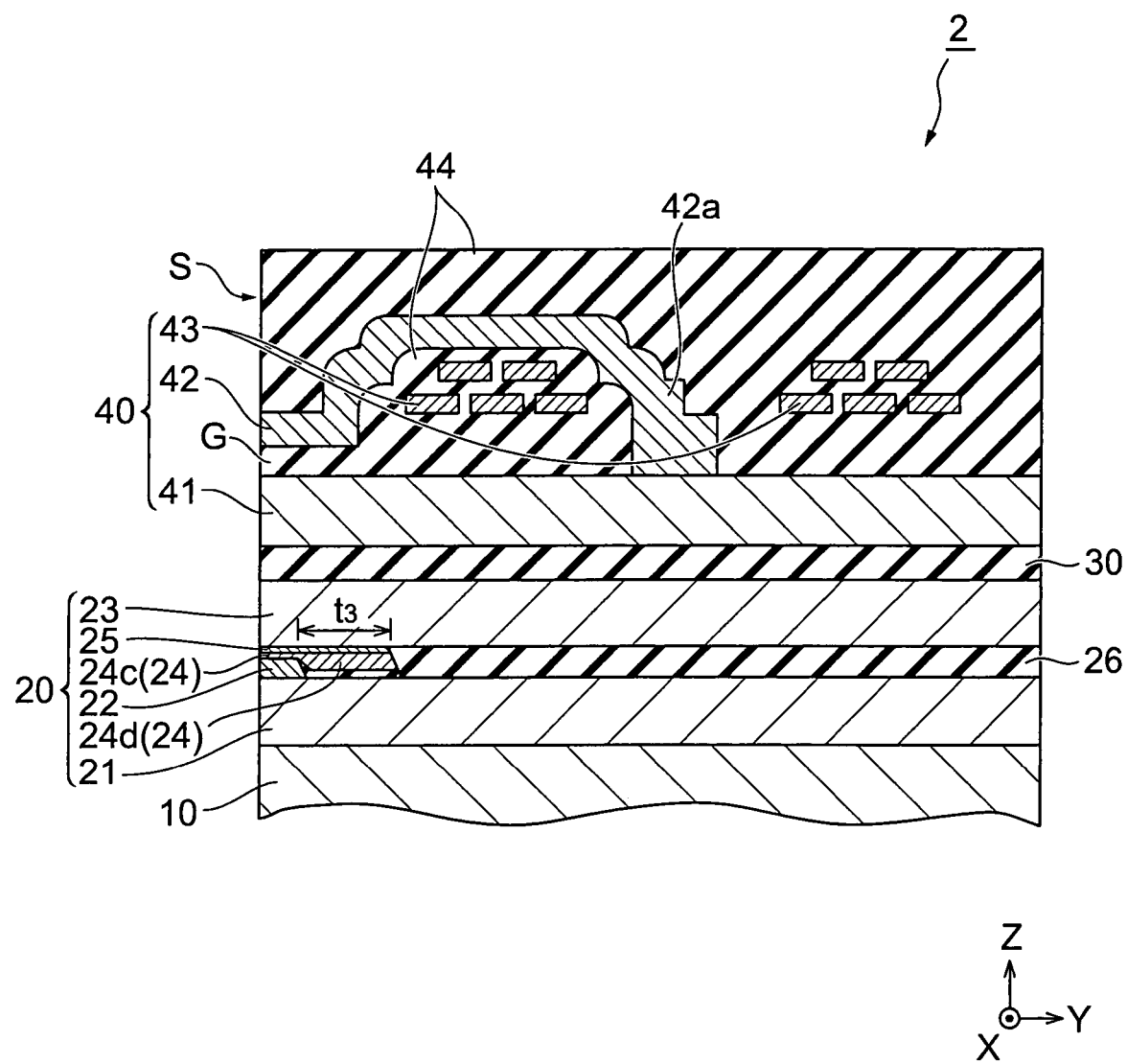
Figure 15:
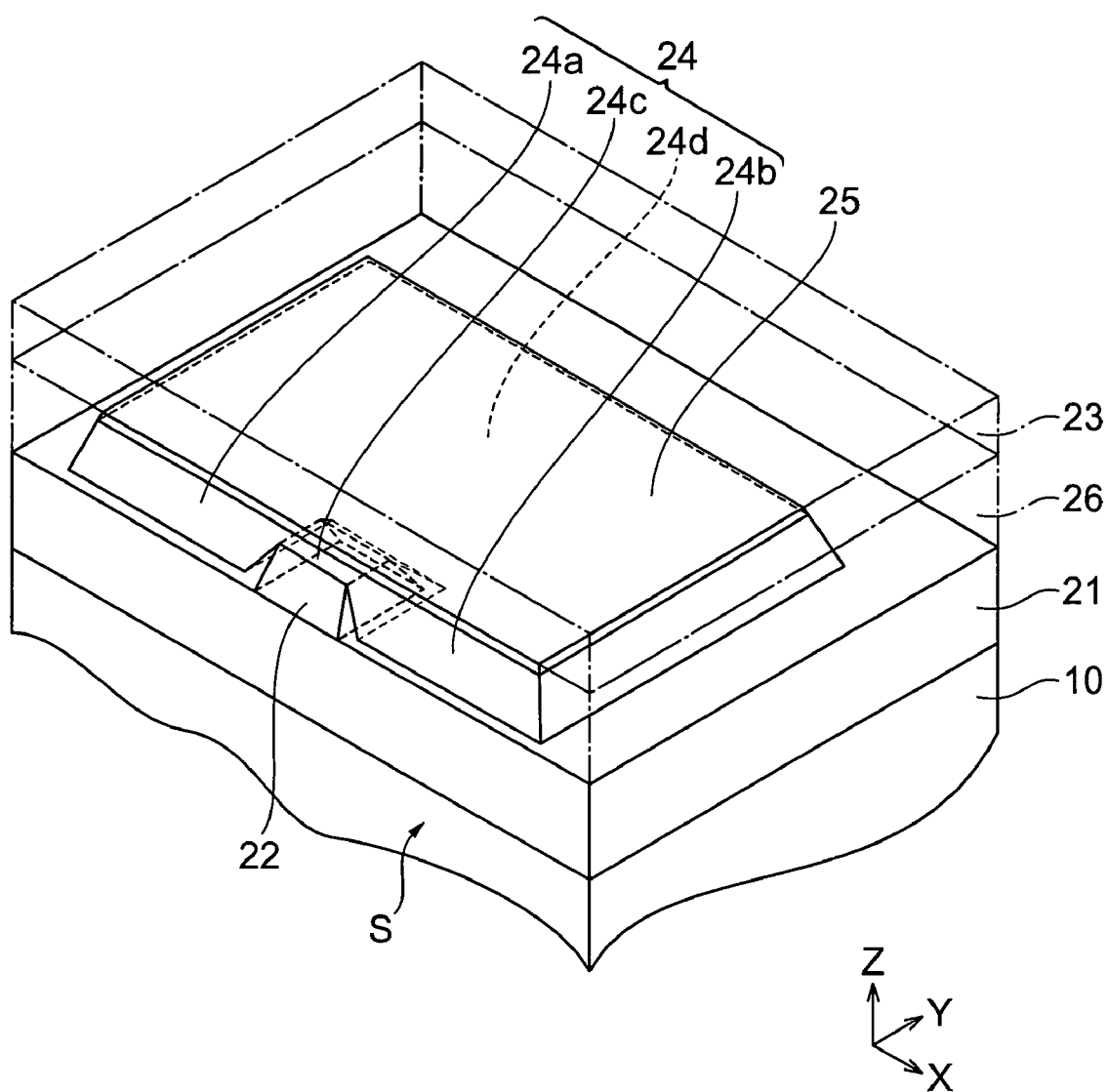
Figure 17:
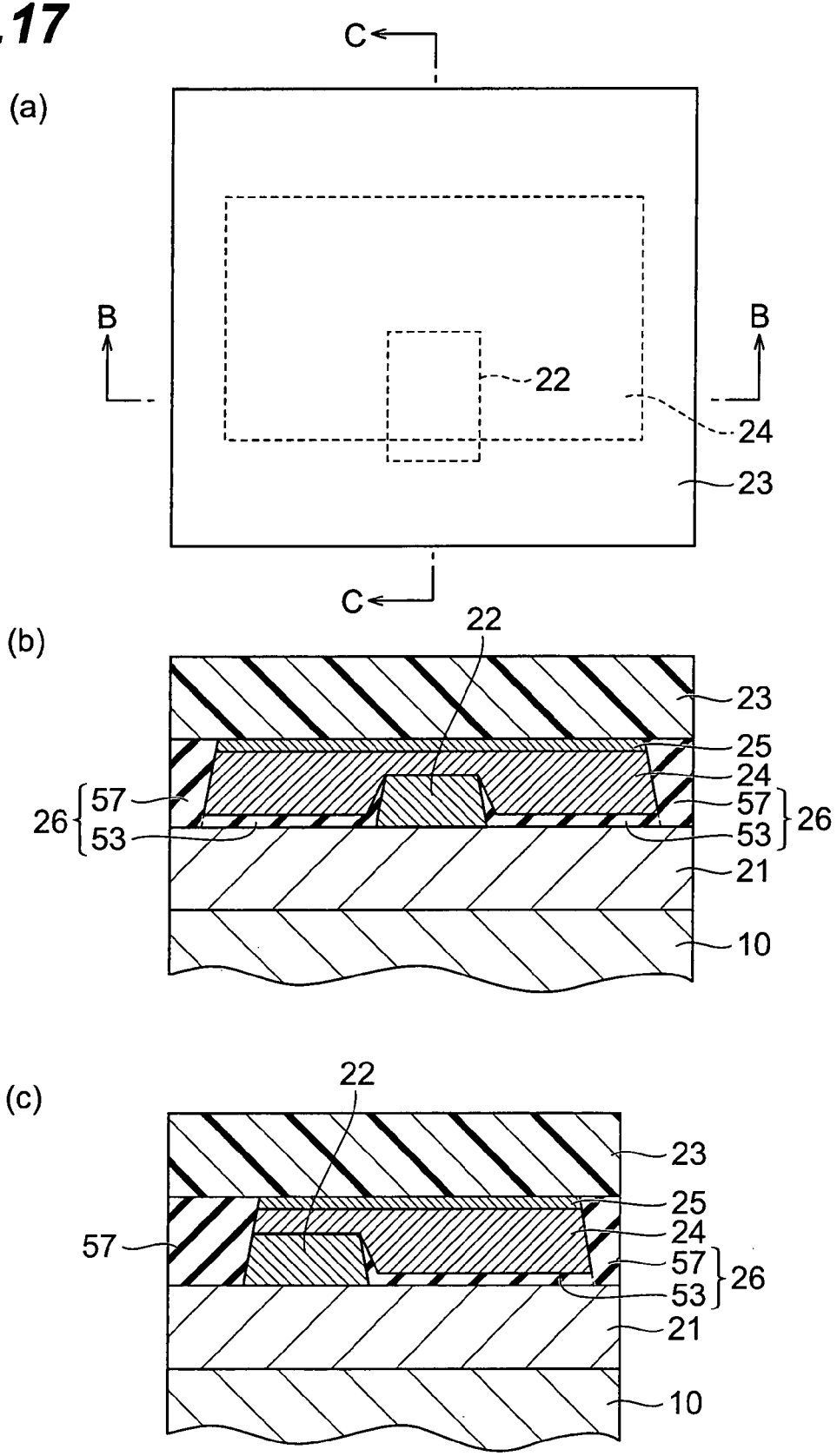
Figure 18:
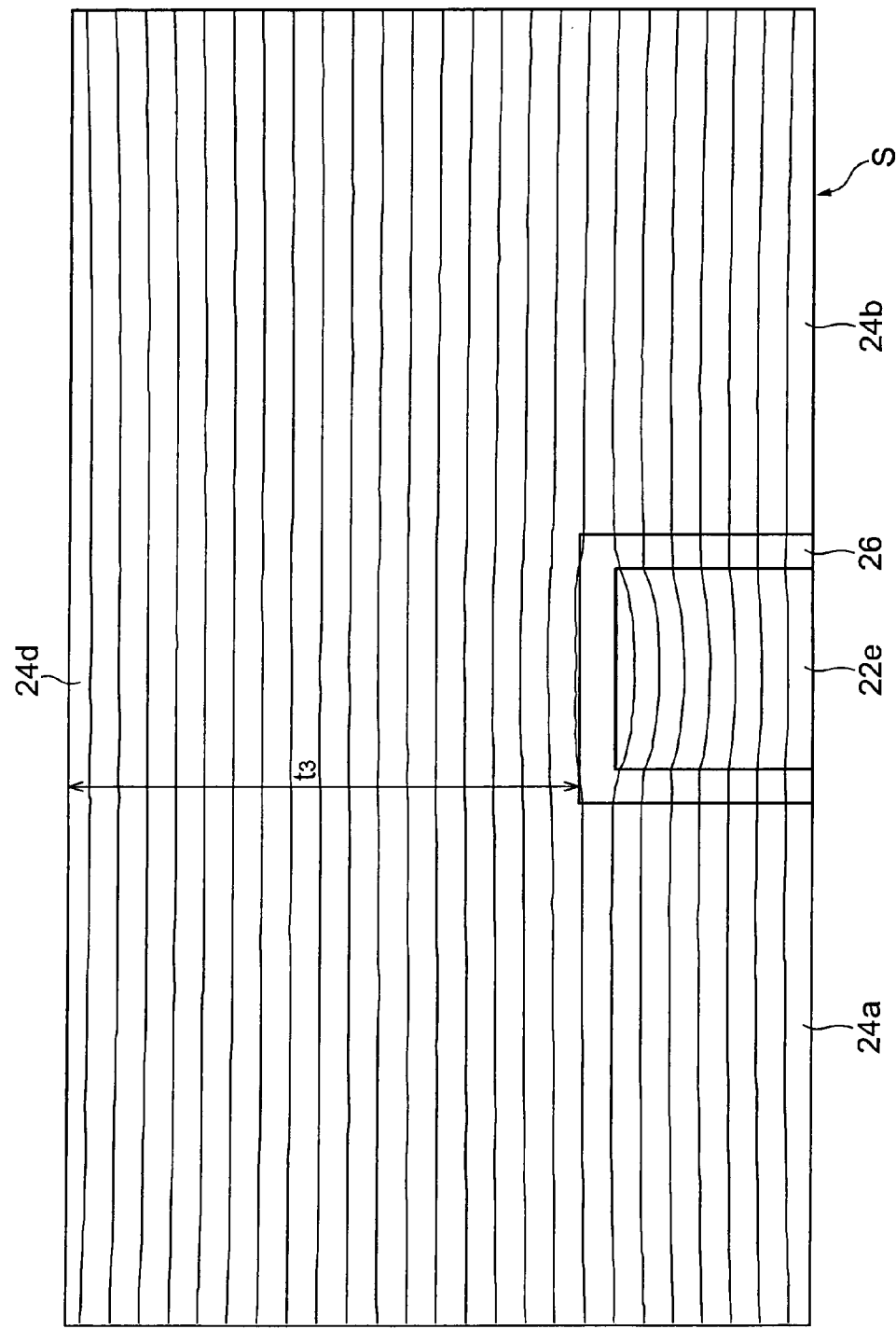
Figure 19:
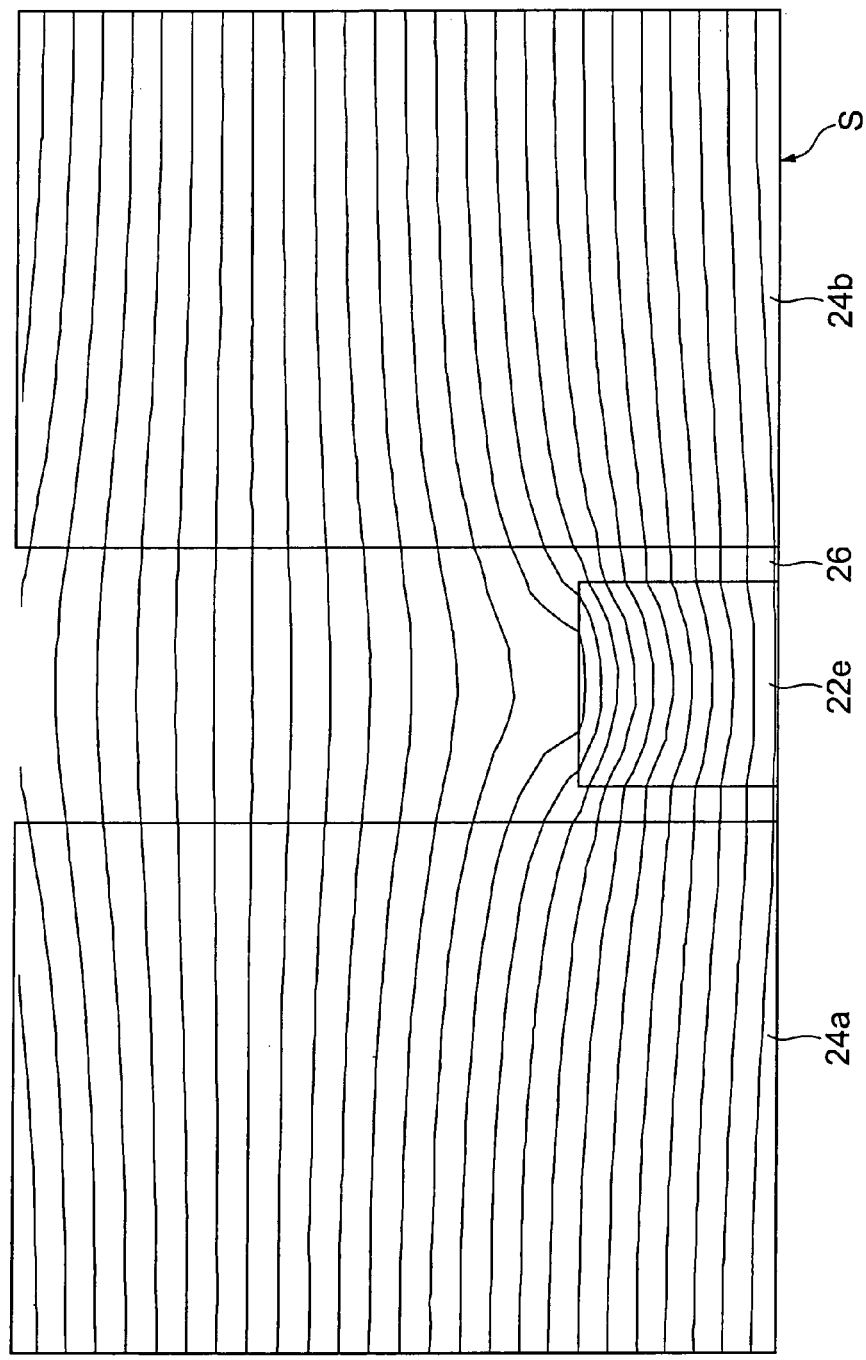
Figure 20:
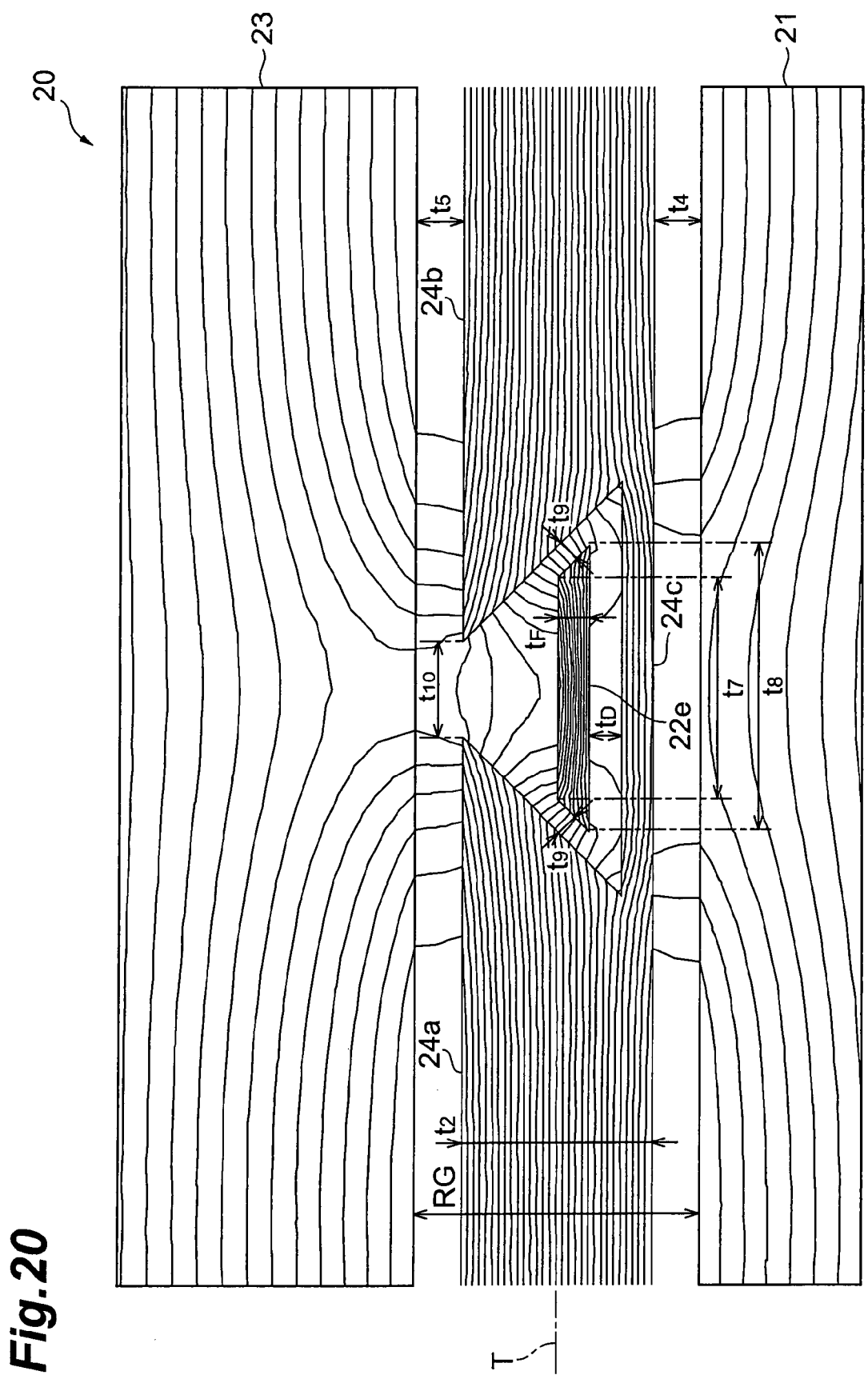
Figure 21:
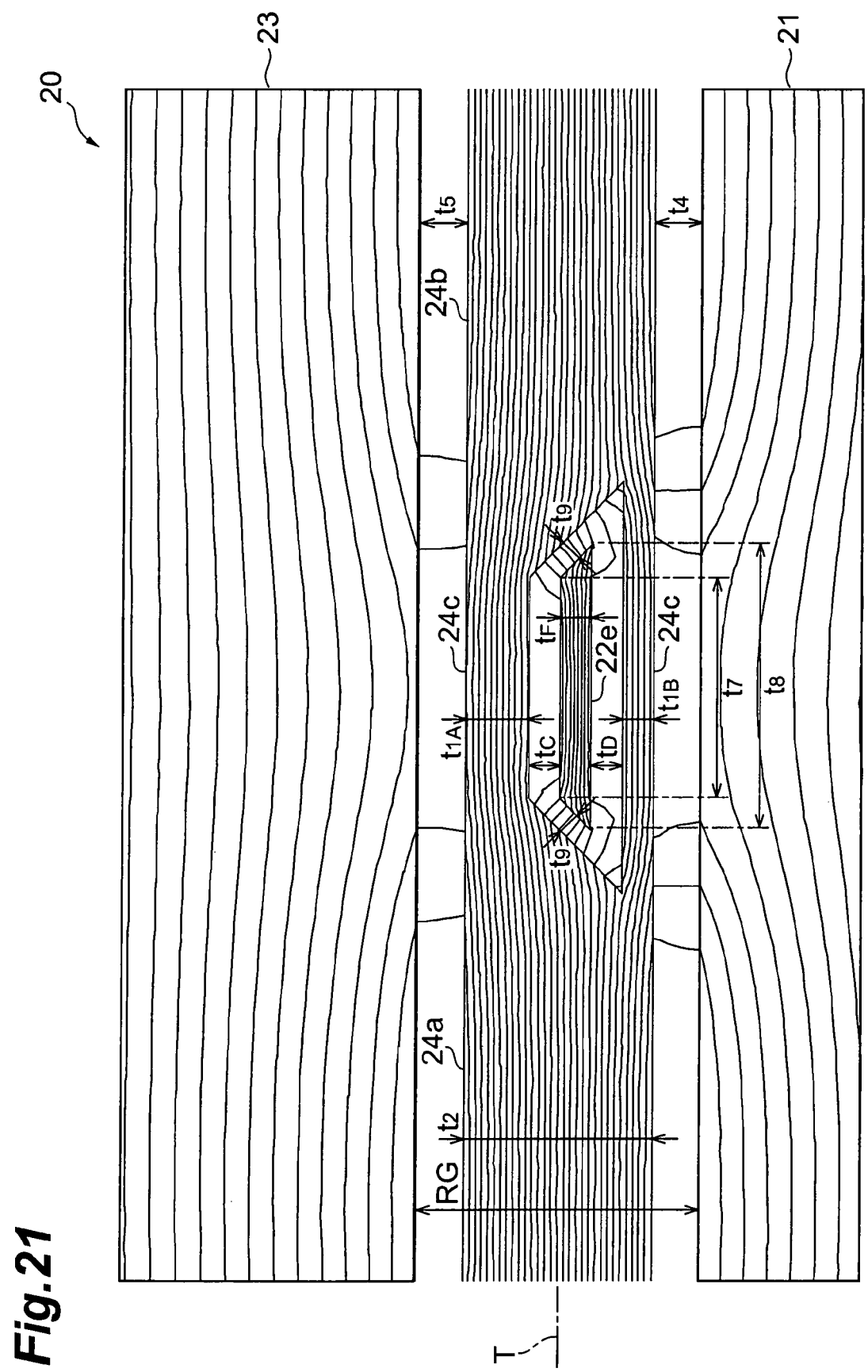
Figure 22:
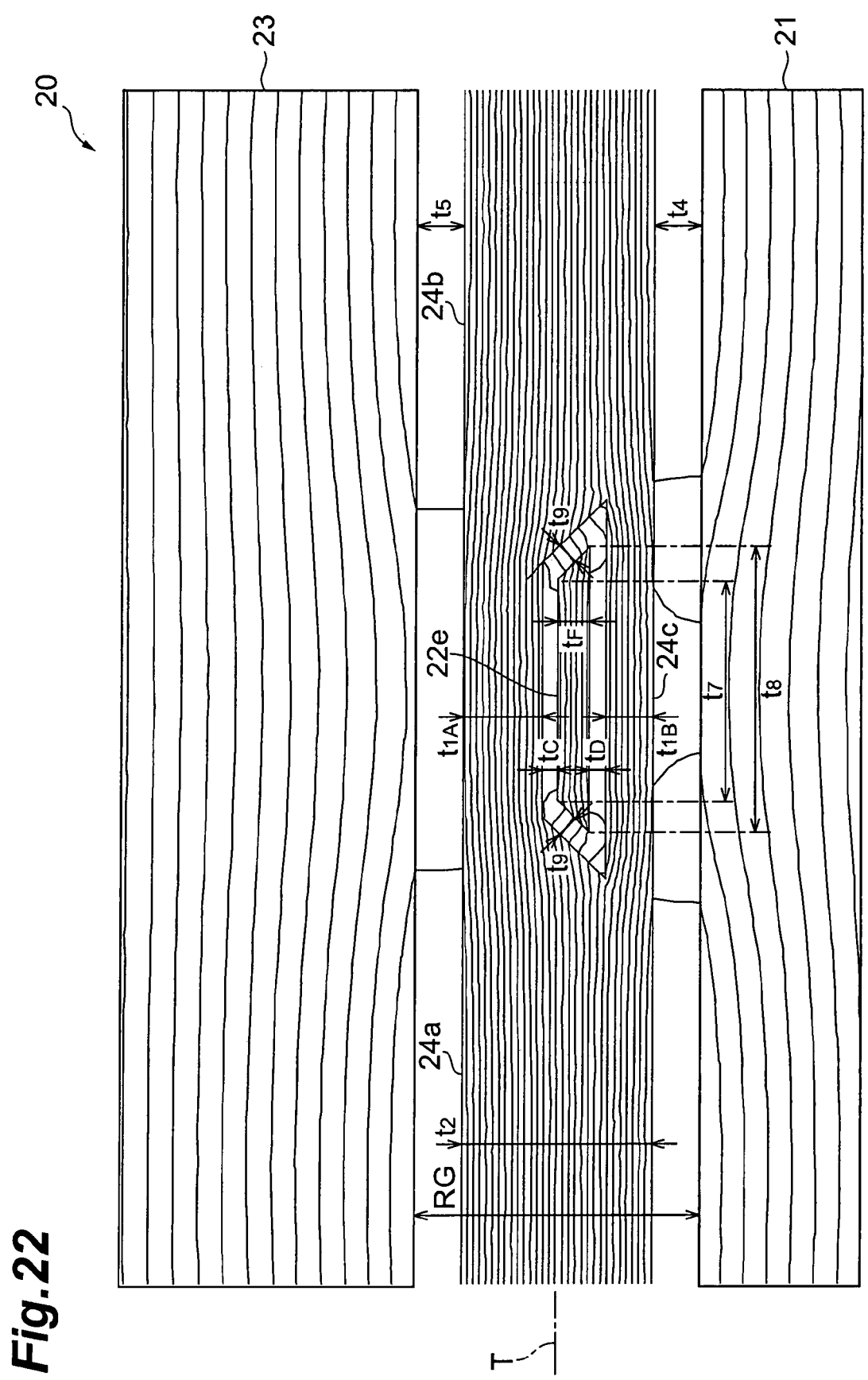

(a) of FIG. 5 is a plane view of a portion of a manufacturing process of the read head portion of the first embodiment, and (b) of FIG. 5 is a cross-sectional view along line B-B in (a) of FIG. 5;

(a) of FIG. 6 is a plane view of a process following that of FIG. 5, and (b) of FIG. 6 is a cross-sectional view along line B-B in (a) of FIG. 6;

(a) of FIG. 7 is a plane view of a process following that of FIG. 6, and (b) of FIG. 7 is a cross-sectional view along line B-B in (a) of FIG. 7;

(a) of FIG. 8 is a plane view of a process following that of FIG. 7, and (b) of FIG. 8 is a cross-sectional view along line B-B in (a) of FIG. 8;

(a) of FIG. 9 is a plane view of a process following that of FIG. 8, and (b) of FIG. 9 is a cross-sectional view along line B-B in (a) of FIG. 9;

FIG. 10 shows a state of magnetic lines of force in the read head portion of the thin film magnetic head of an example 1-1, seen from the media-opposed surface;

FIG. 11 shows a state of magnetic lines of force in the read head portion of the thin film magnetic head of an example 1-2, seen from the media-opposed surface;

FIG. 12 shows a state of magnetic lines of force in the read head portion of the thin film magnetic head of a comparative example 1-1, seen from the media-opposed surface;

FIG. 13 shows a state of magnetic lines of force in a virtual plane, in the read head portions of the thin film magnetic heads of examples 1-1 and 1-2 and comparative example 1-1;

FIG. 14 is a summary cross-sectional view of the thin film head of a second embodiment, seen from the track width direction perpendicular to the media-opposed surface;

FIG. 15 is a perspective view showing in perspective a portion of the read head portion of the thin film magnetic head of the second embodiment;

(a) of FIG. 16 is a plane view of a portion of a manufacturing process of the read head portion of the thin film magnetic head of the second embodiment, and (b) of FIG. 16 is a cross-sectional view along line B-B in (a) of FIG. 16;

(a) of FIG. 17 is a plane view of a process following that of FIG. 16, and (b) of FIG. 17 is a cross-sectional view along line B-B in (a) of FIG. 17;

FIG. 18 shows a state of magnetic lines of force in the read head portion of the thin film magnetic head of an example 2-1, seen in a virtual plane;

FIG. 19 shows a state of magnetic lines of force in the read head portion of the thin film magnetic head of a comparative example 2-1, seen in a virtual plane;

FIG. 20 shows a state of magnetic lines of force in the read head portion of the thin film magnetic head of a third embodiment, seen from the media-opposed surface;

FIG. 21 shows a state of magnetic lines of force in the read head portion of the thin film magnetic head of a fourth embodiment, seen from the media-opposed surface; and, FIG. 22 shows a state of magnetic lines of force in the read head portion of the thin film magnetic head of a fifth embodiment, seen from the media-opposed surface.

DESCRIPTION OF THE PREFERRED EMBODIMENTS

Below, preferred embodiments of the invention are explained, referring to the drawings. The same symbols are used for the same elements, and redundant explanations are omitted.

First Embodiment (Configuration of Thin Film Magnetic Head)

Figure 1:
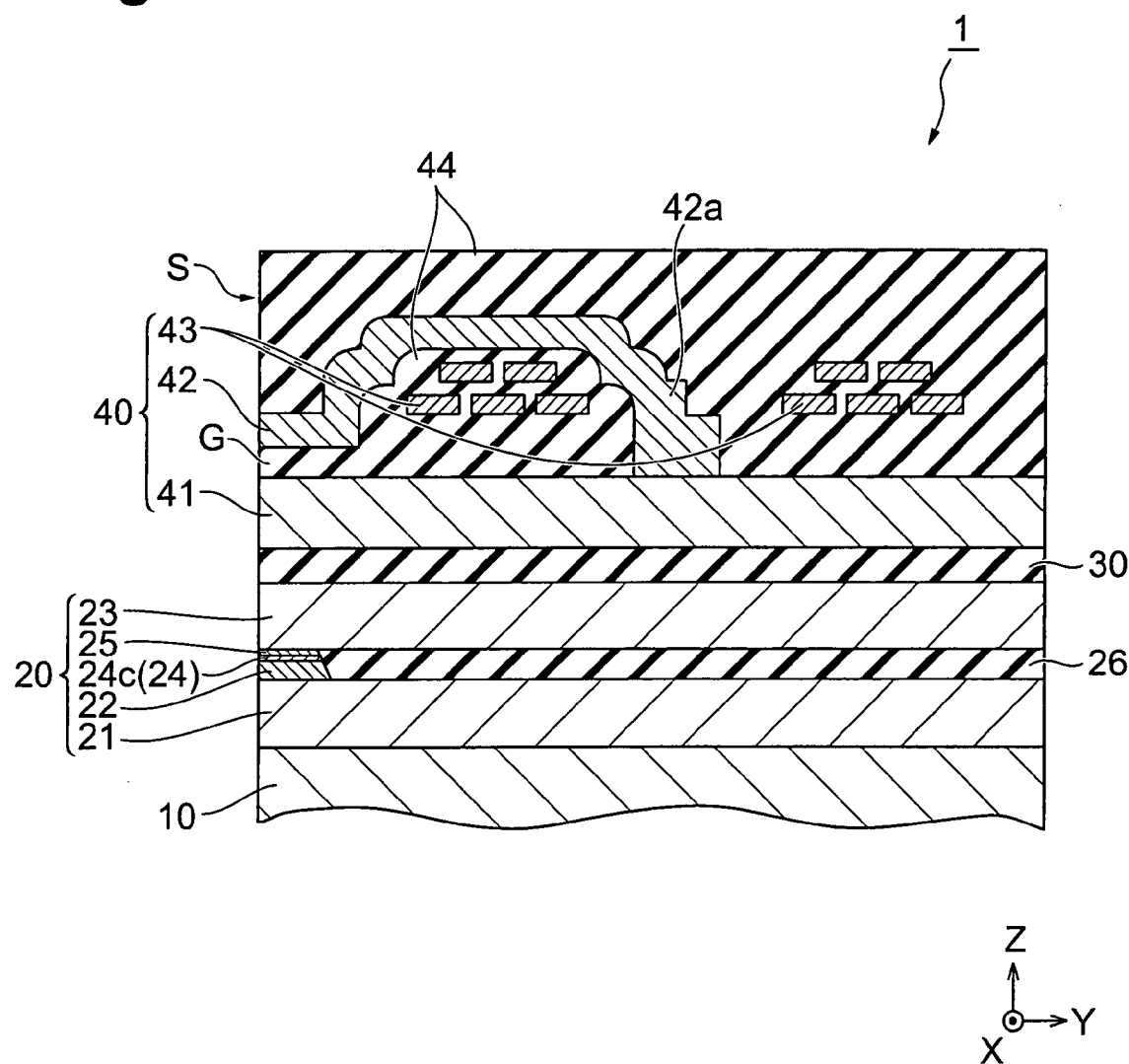
FIG. 1 is a summary cross-sectional view of the thin film magnetic head of a first embodiment, seen from the track width direction perpendicular to the media-opposed surface.
Figure 2:
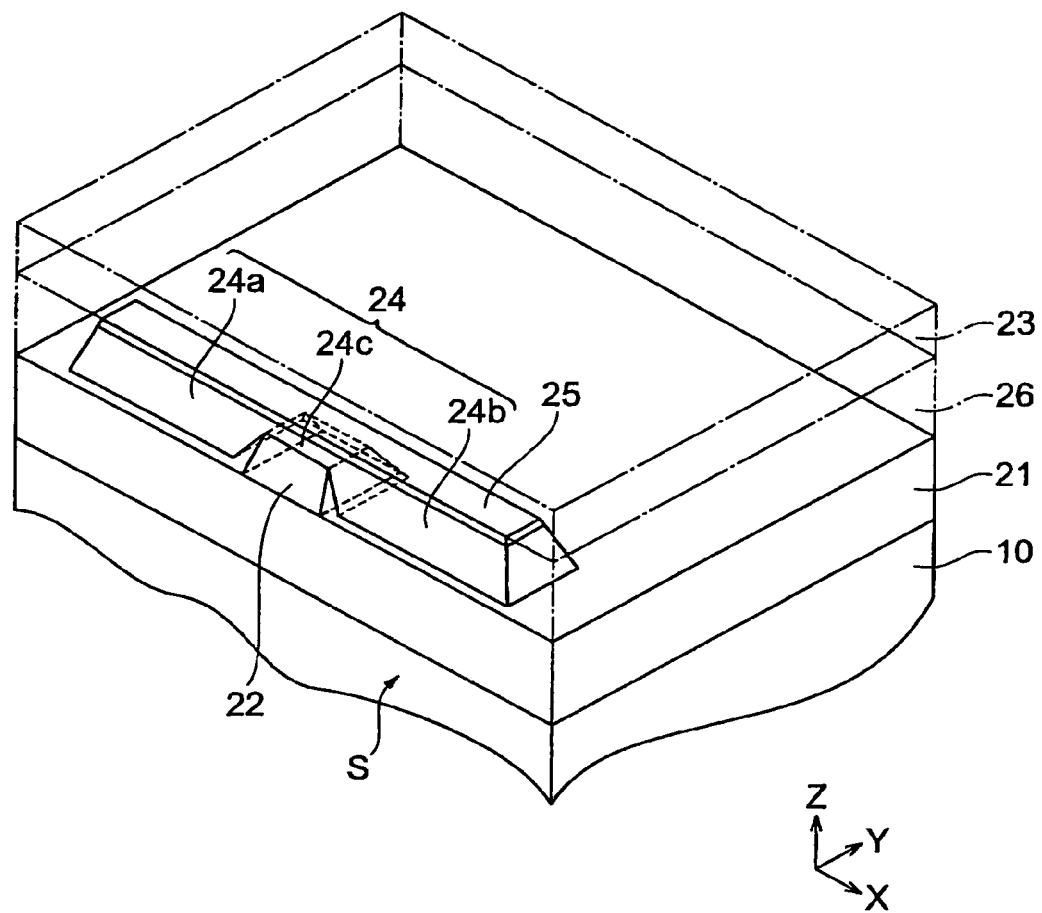
FIG. 2 is a perspective view showing in perspective a portion of the read head portion of the thin film magnetic head of the first embodiment.
Figure 3:
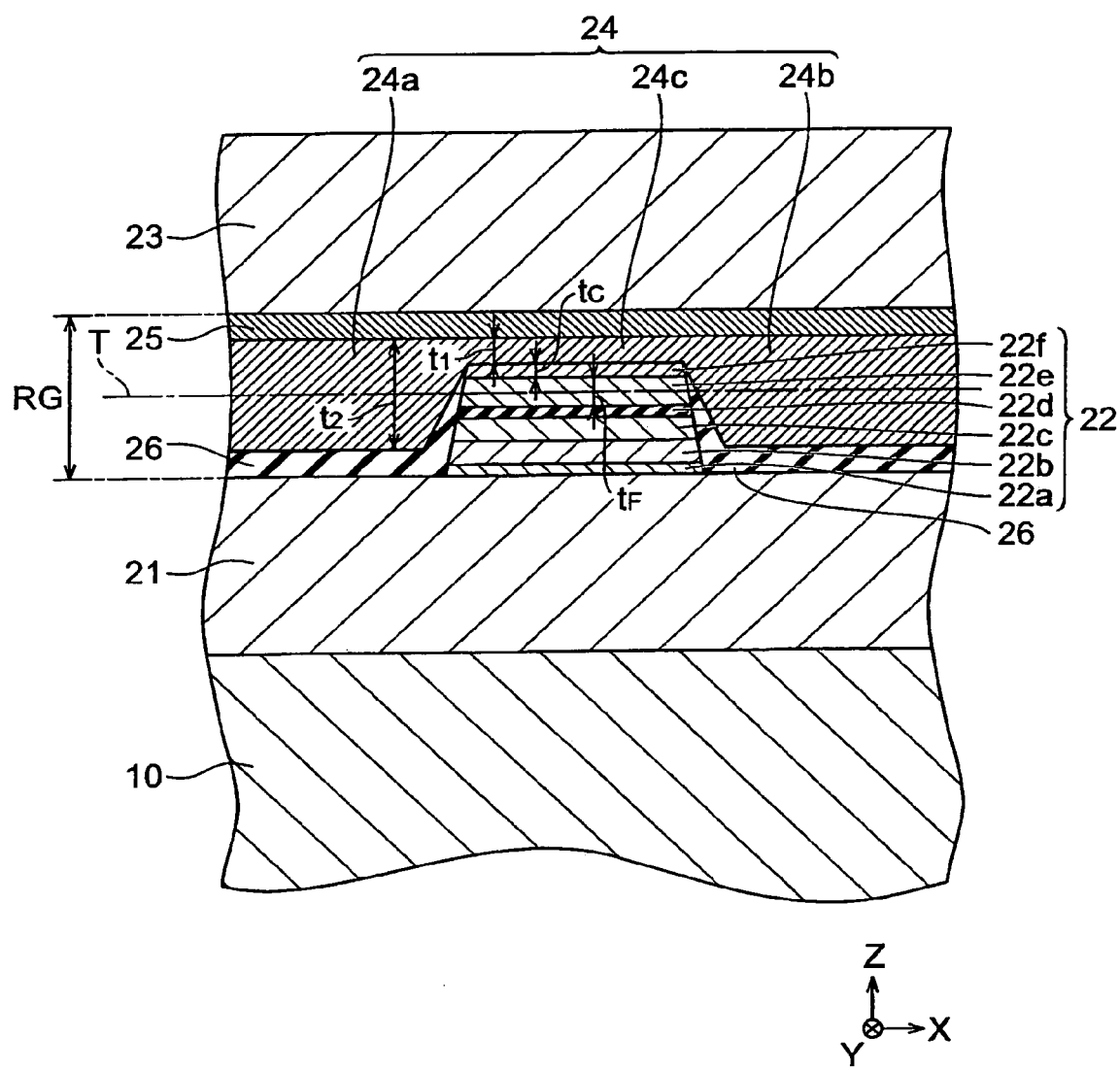
FIG. 3 is a partial enlarged view of the TMR element, seen from the media-opposed surface.

The configuration of the thin film magnetic head 1 of the first embodiment is explained, referring to FIG. 1 through FIG. 3.

The thin film magnetic head 1 is provided on the upper portion of a base 10, and is one portion of a magnetic head slider, not shown. The thin film magnetic head 1 is a hybrid-type thin film magnetic head, formed by layering on the base 10 in order a read head portion 20, having a TMR (Tunneling Magneto Resistance) element 22, described below; an insulating layer 30; and a recording head portion 40, as an induction-type electromagnetic transducer element for writing. In the thin film magnetic head 1, the end face on the left side in FIG. 1 is a media-opposed surface (air bearing surface) S, which opposes the recording surface of the hard disk, not shown. The base 10 is not shown in detail, a base layer of alumina ($Al_2O_3$) or another electrically insulating material is formed to a thickness of approximately 0.3 μm to 5.0 μm on a substrate comprising AlTiC ($Al_2O_3$.TiC).

The read head portion 20 is formed by layering in order, on the base 10, a lower magnetic shield layer 21 which also serves as a lower electrode; a TMR element 22; and an upper magnetic shield layer 23 which also serves as an upper electrode. A bias-applying layer 24 which applies a bias magnetic field to the TMR element 22, and a metal film 25 are formed between the lower magnetic shield layer 21 and the upper magnetic shield layer 23.

The lower magnetic shield layer 21 and the upper magnetic shield layer 23 comprise NiFe (Permalloy) or another conductive soft magnetic layer, and prevent detection by the TMR element 22 of unwanted external magnetic fields.

The TMR element 22 is placed on the side of the media-opposed surface S so as to be exposed on the media-opposed surface S. As shown in detail in FIG. 3 in particular, the TMR element 22 is formed by layering, in order, a lower metal layer 22a, a pinning layer 22b, a pinned layer 22c, a tunnel barrier layer 22d, a free layer 22e, and an upper metal layer 22f. A sense current flows in the TMR element 22 in the direction of layering of the layers 22a to 22f comprised by the TMR element 22 (the film thickness direction of the free layer 22e; the Z-axis direction in FIG. 1 through FIG. 3).

As shown in FIG. 3, the lower metal layer 22a comprises Ta or another nonmagnetic conductive metal material, and is provided to adjust the read gap to a desirable value according to the recording density of the recording media. The pinning layer 22b is an antiferromagnetic material such as PtMn, NiO or similar, and is deposited on the lower metal layer 22a. At this time, the lower metal layer 22a functions as a base layer. The pinned layer 22c comprises Fe, Co, Ni, NiFe, CoFe, CoZrNb, FeCoNi, or another soft magnetic material, and is deposited on the pinning layer 22b. The magnetization direction in the pinned layer 22c is fixed in a constant direction (the depth direction with respect to the media-opposed surface S; the Y-axis direction in FIG. 1 through FIG. 3) by the exchange coupling occurring at the interface between the pinning layer 22b and the pinned layer 22c.

The tunnel barrier layer 22d enables passage of electrons while maintaining spin through a tunneling effect, and can for example be formed from $Al_2O_3$, NiO, MgO, $Ta_2O_5$, $TiO_2$, or another insulating material. The free layer 22e comprises Fe, Co, Ni, NiFe, CoFe, CoZrNb, FeCoNi, or another soft magnetic material, and is deposited on the tunnel barrier layer 22d. The direction of magnetization in the free layer 22e changes according to a leakage magnetic field from the recording media, that is, according to an external magnetic field. The upper metal layer 22f comprises Ta or another nonmagnetic conductive metal material, and is deposited on the free layer 22e. This upper metal layer 22f, like the lower metal layer 22a, adjusts the read gap to a desirable value according to the recording density of the recording media.

Here, the free layer 22e is positioned substantially in the center in the layering direction between the lower magnetic shield layer 21 and the upper magnetic shield layer 23. The free layer 22e is positioned on a virtual plane T (see FIG. 3) which passes substantially through the center in the layering direction of the first portion 24a and second portion 24b of the bias-applying layer 24. That is, in this embodiment, the substantial center in the layering direction between the lower magnetic shield layer 21 and the upper magnetic shield layer 23 is also positioned on the virtual plane T.

In place of the TMR element 22, a GMR (Giant MagnetoResistive) element, which utilizes the giant magnetoresistance effect with high magnetoresistance change, an AMR (Anisotropy MagnetoResistive) element, which utilizes the anisotropic magnetoresistance effect, or a CPP (Current Perpendicular to Plane)-GMR element, can be employed; it is particularly preferable however that the TMR element 22 or the CPP-GMR element, in which the sense current flows in the direction of the film thickness of the free layer 22e (the Z-axis direction in FIG. 1 through FIG. 3), be used. This is because, as explained below, the bias-applying layer 24 has a third portion 24c, and so by using the TMR element 22 or the CPP-GMR element in which the sense current flows in the direction of film thickness of the free layer 22e, the thin film magnetic head 1 can have a simpler structure than when using another element in which the sense current flows in the track width direction (the X-axis direction in FIG. 1 through FIG. 3).

The bias-applying layer 24 comprises CoPt or another hard magnetic material. As shown in detail in FIG. 2 and FIG. 3 in particular, the bias-applying layer 24 has a first portion 24a, a second portion 24b, and a third portion 24c. The first portion 24a and the second portion 24b are positioned on either side of the TMR element 22 in the track width direction via the insulating layer 26. That is, the first portion 24a and the second portion 24b are positioned at a distance in the track width direction, enclosing the TMR element 22 therebetween.

The third portion 24c is positioned between the upper magnetic shield layer 23 and the TMR element 22, and connects the first portion 24a and the second portion 24b. It is preferable that the thickness $t_1$ (see FIG. 3) of the third portion 24c in the layering direction be 2 nm or greater, and be less than ½ the straight-line distance in the layering direction between the lower magnetic shield layer 21 and the upper magnetic shield layer 23 (that is, the read gap) RG, and be smaller than the magnitude of the layering-direction thickness $t_2$ (see FIG. 3) of the first portion 24a and the second portion 24b less the layering-direction straight-line distance $t_C$ between the free layer 22e and the third portion 24c and less the layering-direction thickness $t_F$ of the free layer 22e (that is, that $t_1 \geq 2$ nm, and that $t_1 < RG/2$, and that $t_1 < t_2 - t_C - t_F$).

Figure 4:
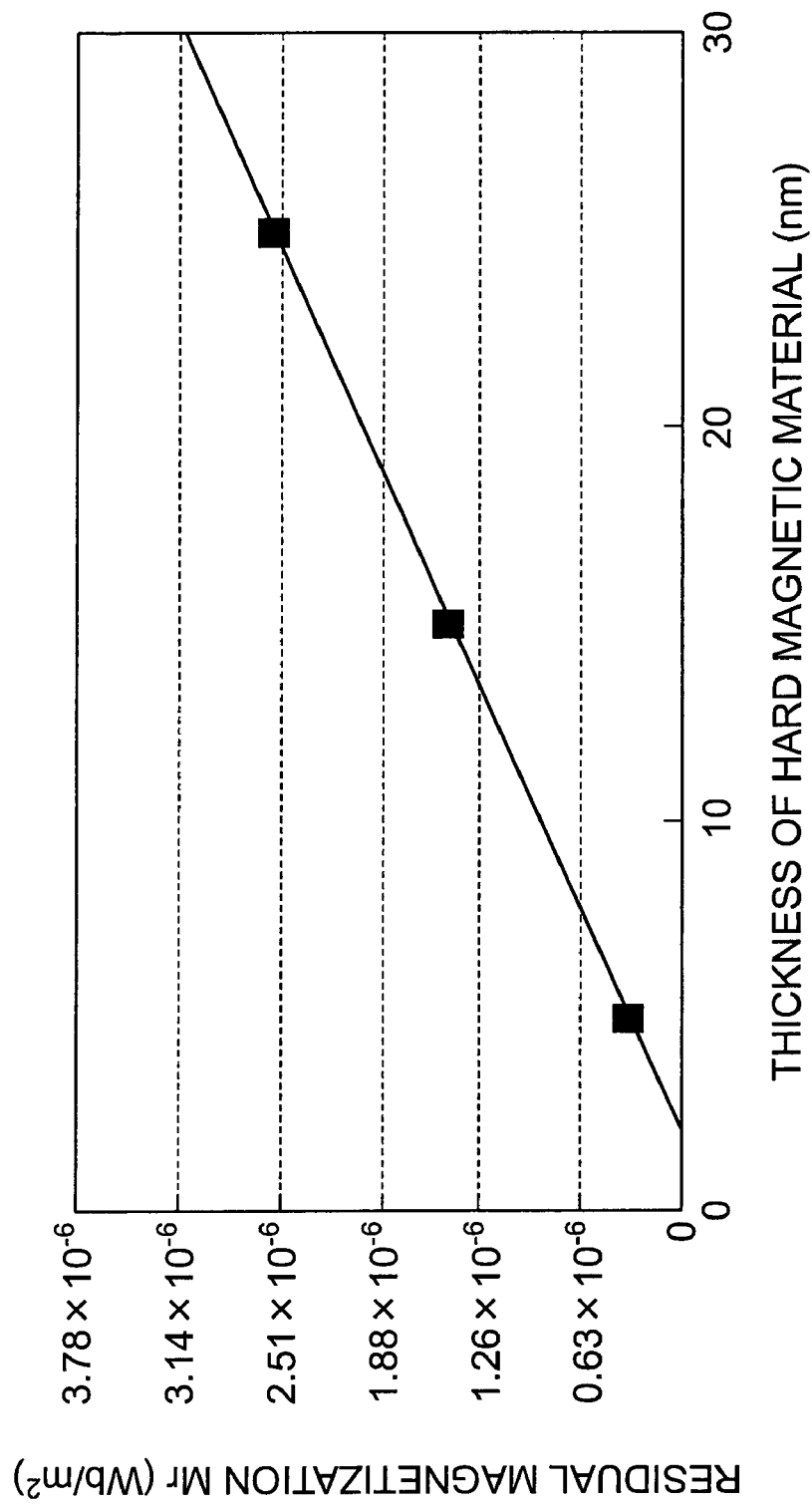
FIG. 4 shows the relation between the thickness of hard magnetic material and residual magnetization.

If the thickness $t_1$ of the third portion 24c in the layering direction, that is, the thickness of the hard magnetic material comprised by the bias-applying layer 24, is less than 2 nm, then as indicated in FIG. 4 the residual magnetization $M_r$ approaches zero, and magnetic properties do not readily appear in the third portion 24c. If the thickness $t_1$ of the third portion 24c in the layering direction is equal to or greater than ½ the read gap RG, then the free layer 22e cannot be positioned substantially in the center of the read gap RG, and if the free layer 22e is positioned outside the substantial center of the read gap RG, then as a result the bias-applying layer 24 is positioned closer to either the lower magnetic shield layer 21 or to the upper magnetic shield layer 23, and as a result excess space occurs between the lower magnetic shield layer 21 and the upper magnetic shield layer 23, and the thickness of the thin film magnetic head 1 in the layering direction is increased. And if the thickness $t_1$ of the third portion 24c in the layering direction is greater than the magnitude of the thickness $t_2$ in the layering direction of the first portion 24a and the second portion 24b less the layering-direction straight-line distance $t_C$ between the free layer 22e and the third portion 24c and less the layering-direction thickness $t_F$ of the free layer 22e, then at least a portion of the free layer 22e is positioned below the lower face of the first portion 24a and the second portion 24b, so that the bias magnetic field of the bias-applying layer 24 is not readily applied to the free layer 22e.

The metal layer 25 comprises Ta or another nonmagnetic conductive metal material, and is deposited on the bias-applying layer 24. This metal layer 25 adjusts the read gap to a desired value according to the recording density of the recording media, similarly to the lower metal layer 22a and upper metal layer 22f.

The insulating layer 26 comprises electrically insulating $Al_2O_3$, $SiO_2$ or another metal oxide, and is provided in order to cause the sense current to flow reliably into the TMR element 22.

Returning to FIG. 1, the insulating layer 30 comprises electrically insulating $Al_2O_3$, $SiO_2$ or another metal oxide, and is positioned so as to be enclosed between the read head portion 20 and the recording head portion 40. The thickness in the layering direction of the insulating layer 30 can be set to, for example, approximately 0.1 μm to 2.0 μm.

The recording head portion 40 has, in order from the substrate 10, a lower magnetic pole layer 41 and an upper magnetic pole layer 42, and also has a thin film coil 43. Between the lower magnetic pole layer 41 and the thin film coil 43, between the upper magnetic pole layer 42 and the thin film coil 43, and above the upper magnetic pole layer 42, an insulating layer 44 is formed, comprising an electrically insulating $Al_2O_3$, $SiO_2$, or other metal oxide, or an organic insulating material which is a resist.

The lower magnetic pole layer 41 and the upper magnetic pole layer 42 comprise FeAlN, FeN, FeCo, CoFeN, FeZrN, or another material with high saturation flux density. The edge portions on the side of the media-opposed surface S of the lower magnetic pole layer 41 and the upper magnetic pole layer 42 have a prescribed gap and are exposed to the media-opposed surface S, forming a recording gap G. On the other hand, the edge portion 42a on the side distant from the media-opposed surface S of the upper magnetic pole layer 42 is connected to the lower magnetic pole layer 41, and the lower magnetic pole layer 41 and the upper magnetic pole layer 42 are magnetically linked. Hence, the lower magnetic pole layer 41 and the upper magnetic pole layer 42 form a magnetic circuit surrounding the recording gap G.

The thin film coil 43 is positioned so as to surround the end portion 42a of the upper magnetic pole layer 42, and generates a magnetic field in the recording gap G by means of electromagnetic induction, to cause storage of magnetic information in the recording surface of the hard disk.

(Method of Manufacture of the Read Head Portion)

Next, a method of manufacture of the read head portion 20 comprised by the thin film magnetic head 1 is explained, referring to FIG. 1 and to FIG. 5 through FIG. 9. In each of the figures, only one element is shown; in general, however, a plurality of thin film magnetic heads are manufactured from a single substrate (wafer).

First, FIG. 5 is used in the explanation. On the base 10 comprising an insulating material formed on an AlTiC substrate, the lower magnetic shield layer 21 and a TMR film 51 serving as the TMR element 22 are layered in order to prescribed thicknesses. As the method of formation, for example, the lower magnetic shield layer 21 is formed by a wet plating method, and the TMR film 51 can be formed by a sputtering method; in addition, other well-known techniques can be employed. In order to impart a desired magnetic anisotropy to the lower magnetic shield layer 21 and the TMR film 51, each layer can be formed while applying a magnetic field as necessary, and heat treatment can be performed after formation of each layer.

The next process is explained referring to FIG. 6. A resist film 52 is formed on the upper portion of the TMR film 51, so as to cover the area in which the TMR element 22 is to be formed. The resist film 52 is formed by applying, to the surface of the TMR film 51, a resist material which is polymerized by irradiation with light or an electron beam, and after irradiation with light or an electron beam, by performing development treatment. When the resist film 52 is formed, the surface of the TMR film 51 is exposed in areas other than the area in which the TMR element 22 is to be formed.

This resist film 52 is used as a meask to remove the exposed area, from the surface of the TMR film 51 to the surface of the lower magnetic shield layer 21, by ion milling or a similar technique. Then, with the resist film 52 remaining, sputtering or another method is used to layer, over the entire surface, an insulating film 53, comprising a nonmagnetic insulating material.

The next process is explained referring to FIG. 7. The resist film 52 is stripped away (lifted off) together with material accumulated on the resist film 52 (the insulating film 53). A hard magnetic material is then deposited over the entire surface of this intermediate; to form a hard magnetic layer 54. At this time, the portion of the hard magnetic layer 54 positioned at the TMR element 22 protrudes upwards, as shown in FIG. 7.

The next process is explained referring to FIG. 8. The entire surface of the intermediate is flattened by performing chemical-mechanical polishing (CMP), to remove the upward-protruding portion of the hard magnetic layer 54. Then, a metal film 55 is formed over the entirety of the intermediate. On the metal film 55 is then formed a resist film 56, to determine the end portion of the TMR element 22 in the height direction (the depth direction with respect to the media-opposed surface S; the Y-axis direction in FIG. 1 through FIG. 3), as well as to determine the size of the bias-applying layer 24. That is, in the first embodiment, the width of the resist film 56 in the depth direction with respect to the media-opposed surface S is smaller than the width of the TMR element 22 in the depth direction with respect to the media-opposed surface S. The resist film 56 is formed by applying a resist material which is polymerized by irradiation with light or an electron beam, and after irradiation with light or an electron beam, by performing development treatment.

The next process is explained referring to FIG. 9. Using the resist film 56 as a mask, the exposed surface area is removed, by ion milling or similar, to the surface of the lower magnetic shield layer 21. Then, with the resist film 56 remaining, sputtering or another method is used to deposit, on the entire surface of the intermediate, an insulating film 57 comprising a nonmagnetic insulating material. Thereafter, the resist film 56 is stripped away (lifted off) together with the material accumulated on the resist film 56 (the insulating film 57). Then, the upper magnetic shield layer 23 is deposited. The upper magnetic shield layer 23 can be formed by a wet plating method, for example. In this way, the read head portion 20 is obtained. The insulating films 53, 57 serve as the insulating layer 26, the hard magnetic layer 52 serves as the bias-applying layer 24, and the metal film 55 serves as the metal layer 25.

Thereafter, although details are omitted, an insulating layer 30 is deposited onto the read head portion 20, after which a well-known method is employed to form the recording head portion 40 on the insulating layer 30, to obtain the thin film magnetic head 1, as shown in FIG. 1. After formation of the thin film magnetic head 1, by applying an external magnetic field in the track width direction (the X-axis direction in FIG. 1 through FIG. 3), the bias-applying layer 24 is magnetized in the track width direction.

After forming a plurality of thin film magnetic heads 1 on a wafer in this way, a dicing process is used to fabricate a plurality of bars (not shown) from the wafer. A plurality of thin film magnetic heads 1 are arranged in a row on each bar. In this stage of bar fabrication, a lapping (polishing) process is performed to adjust the height of the MR element 22. During the lapping process, lapping is performed from the lapping surface, which will become the media-opposed surface S, in the depth direction with respect to the media-opposed surface S, and lapping is halted when a prescribed height for the TMR element 22 is obtained. After the lapping process has ended, each bar is cut into block units comprising a thin film magnetic head 1, and sliders are formed to obtain so-called head sliders. This concludes the series of manufacturing processes for thin film magnetic heads 1.

In the above-described first embodiment, the bias-applying layer 24 has the first through third portions 24a to 24c, and the third portion 24c connects the first portion 24a and the second portion 24b between the TMR element 22 and the upper magnetic shield layer 23. Hence, magnetic flux which would tend to flow into the free layer 22e in the layering direction if there were no third portion 24c instead passes through the third portion 24c. As a result, the inflow of magnetic flux into the free layer 22e from the layering direction can be suppressed.

Tests were conducted to confirm that, in a thin film magnetic head 1 of the first embodiment, inflow into the free layer 22e from the layering direction of magnetic flux in the bias magnetic field generated by the bias-applying layer 24 is suppressed. As tests, the read head portions of thin film magnetic heads having each of the configurations described in the following examples 1-1 and 1-2 and in a comparative example 1-1 were virtually constructed in a computer, and simulations were conducted to trace the lines of force of the bias magnetic field generated by the bias-applying layer 24.

EXAMPLE 1-1

In example 1-1, the thickness $t_1$ in the layering direction of the third portion 24c of the bias-applying layer 24 in the read head portion 20 of the thin film magnetic head 1 of the first embodiment is set to 10 nm, the thickness $t_2$ in the layering direction of the first portion 24a and the second portion 24b of the bias-applying layer 24 is set to 30 nm, the read gap RG is set to 45 nm, the straight-line distance $t_4$ between the bias-applying layer 24 and the lower magnetic shield layer 21 in the layering direction and the straight-line distance $t_5$ between the bias-applying layer 24 and the upper magnetic shield layer 23 in the layering direction are both set to 7.5 nm, the distance $t_6$ between the lower face of the first portion 24a and the lower face of the second portion 24b is set to 125 nm, the straight-line distance $t_C$ between the free layer 22e and the third portion 24c in the layering direction is set to 5 nm, the thickness $t_F$ of the free layer 22e in the layering direction is set to 5 nm, the width $t_7$ of the upper face of the free layer 22e seen from the media-opposed surface S is set to 35 nm, the width $t_8$ of the lower face of the free layer 22e seen from the media-opposed surface S is set to 45 nm, the straight-line distance $t_9$ between the inclined face of the free layer 22e and the first portion 24a or the second portion 24b seen from the media-opposed surface S is set to 3.5 nm, and in addition the free layer 22e is positioned so as to be substantially in the center in the layering direction between the lower magnetic shield layer 21 and the upper magnetic shield layer 23 as well as being positioned in the virtual plane T.

EXAMPLE 1-2

In example 1-2, other than setting the thickness $t_1$ in the layering direction of the third portion 24c of the bias-applying layer 24 to 12.5 nm and setting the straight-line distance $t_C$ in the layering direction between the free layer 22e and the third portion 24c to 2.5 nm, parameters were the same as in example 1-1.

COMPARATIVE EXAMPLE 1-1

In comparative example 1-1, other than the fact that there exists no third portion 24c connecting the first portion 24a and the second portion 24b in the bias-applying layer 24 (with the distance $t_{10}$ between the upper face of the first portion 24a and the upper face of the second portion 24b set to 15 nm), parameters were the same as in example 1-1.

(Evaluation Results)

Evaluation results for the examples 1-1 and 1-2 and comparative example 1-1 appear in FIG. 10 through FIG. 13. As shown in FIG. 10 through FIG. 12, in examples 1-1 and 1-2, the number of magnetic lines of force linked with the free layer 22e in the layering direction is reduced compared with the comparative example 1-1, and it is confirmed that inflow into the free layer 22e from the layering direction of magnetic flux in the bias magnetic field generated by the bias-applying layer 24 is suppressed. The condition of magnetic lines of force of the read head portion 20 in the virtual plane T was the same for the examples 1-1 and 1-2 and comparative example 1-1, as is indicated in FIG. 13.

Second Embodiment

Next, the configuration of the thin film magnetic head 2 of a second embodiment is explained, referring to FIG. 14 and FIG. 15. The thin film magnetic head 2 of the second embodiment differs from the thin film magnetic head 1 of the first embodiment with respect to the structure of the bias-applying layer 24. The following explanation focuses on this difference, and omits redundant explanations.

In addition to the first through third portions 24a to 24c, the bias-applying layer 24 has a fourth portion 24d. The fourth portion 24d is positioned on the side opposite the media-opposed surface S from the TMR element 22 (further inside from the media-opposed surface S than the TMR element 22), and connects the first portion 24a and second portion 24b. As a result, the TMR element 22 is surrounded from four directions by the bias-applying layer 24.

It is preferable that the width $t_3$ in the depth direction with respect to the media-opposed surface S of the fourth portion 24d (see FIG. 14) be 2 nm or greater. If the width $t_3$ in the depth direction with respect to the media-opposed surface S of the fourth portion 24d is less than 2 nm, then similarly to the third portion 24c, magnetic properties do not readily appear in the fourth portion 24d. If the width in the depth direction of the bias-applying layer 24 is made greater than the width in the depth direction of the free layer 22e, as in a thin film magnetic head of the prior art (see FIG. 19, described below), then it is known empirically that the bias magnetic field will become stronger. For this reason, in this second embodiment also the width $t_3$ is made large, in anticipation of such an effect; but the larger the width $t_3$, the greater is the electrostatic capacitance between the lower magnetic shield layer 21 and the upper magnetic shield layer 23, and so it is preferable that $t_3$ be set to an appropriate magnitude, taking both into account. For example, a width $t_3$ of four to five times that of the free layer 22e is preferable, and in particular a width of approximately four times greater is preferable.

Next, in reference to FIG. 16 and FIG. 17, a method of manufacture of the read head portion 20 comprised by the thin film magnetic head 2 of the second embodiment is explained. In the method of manufacture of the read head portion 20 comprised by the thin film magnetic head 2 of the second embodiment, the processes up until formation of a metal film 55 over the entire surface of the intermediate after depositing a hard magnetic material over the entire surface of the intermediate to form a hard magnetic layer 54 (see FIG. 7) and then performing flattening processing of the entire surface of the intermediate by CMP, are the same as in the method of manufacture of the thin film magnetic head 1.

The next process is explained referring to FIG. 16. In the next process, a resist film 56 to determine the size of the bias-applying layer 24 is formed above the metal film 55. In the second embodiment, in order that the TMR element 22 be surrounded on four sides by the bias-applying layer 24, the end portion of the resist film 56 in the depth direction with respect to the media-opposed surface S is positioned further inward in the depth direction with respect to the media-opposed surface S than the end portion of the TMR element 22. The resist film 56 is formed by applying a resist material which is polymerized by irradiation with light or an electron beam, and after irradiation with light or an electron beam, by performing development treatment.

The next process is explained referring to FIG. 17. Using the resist film 56 as a mask, ion milling or another method is employed to remove the area of the exposed surface up to the surface of the lower magnetic shield layer 21. Then, with the resist film 56 remaining, sputtering or another method is used to deposit, on the entire surface of the intermediate, an insulating film 57 comprising a nonmagnetic insulating material. Thereafter, the resist film 56 is stripped away (lifted off) together with the material accumulated on the resist film 56 (the insulating film 57). Then, the upper magnetic shield layer 23 is deposited. The upper magnetic shield layer 23 can be formed by a wet plating method, for example. In this way, the read head portion 20 is obtained. The insulating films 53, 57 serve as the insulating layer 26, the hard magnetic layer 52 serves as the bias-applying layer 24, and the metal film 55 serves as the metal layer 25.

In the thin film magnetic head 2 of the second embodiment as described above, advantageous action similar to that of the thin film magnetic head 1 of the first embodiment is obtained.

Further, in the second embodiment, in addition to the first through third portions 24a to 24c, the bias-applying layer 24 also has the fourth portion 24d, and the fourth portion 24c connects the first portion 24a and the second portion 24b on the side opposite the media-opposed surface S from the TMR element 22. As a result, magnetic flux which would tend to flow into the free layer 22e from the depth direction with respect to the media-opposed surface S when there is no fourth portion 24d and when the width of the bias-applying layer 24 in the depth direction with respect to the media-opposed surface S is greater than the width of the TMR element 22 in the depth direction with respect to the media-opposed surface S, instead flows through the fourth portion 24d. As a result, the inflow of this magnetic flux from the depth direction with respect to the media-opposed surface S into the free layer 22e can be suppressed.

Tests were conducted to confirm that, in a thin film magnetic head 2 of the second embodiment, inflow into the free layer 22e from the depth direction with respect to the media-opposed surface S of magnetic flux in the bias magnetic field generated by the bias-applying layer 24 is suppressed. As tests, the read head portions of thin film magnetic heads having each of the configurations described in the following example 2-1 and in a comparative example 2-1 were virtually constructed in a computer, and simulations were conducted to trace the lines of force of the bias magnetic field generated by the bias-applying layer 24.

EXAMPLE 2-1

In example 2-1, as shown in FIG. 15, the bias-applying layer 24 further has a fourth portion 24d which connects the first portion 24a and the second portion 24b on the side opposite the media-opposed surface S from the TMR element 22, and the width $t_3$ of the fourth portion 24d in the depth direction with respect to the media-opposed surface S is set to 87.5 nm; otherwise the configuration is the same as in example 1-1.

COMPARATIVE EXAMPLE 2-1

In comparative example 2-1, the end portion of the first portion 24a of the bias-applying layer 24 on the deep side with respect to the media-opposed surface S, and the end portion of the second portion 24b of the bias-applying layer 24 on the deep side with respect to the media-opposed surface S, are both extended to the same position as the end portion of the fourth portion 24d of the bias-applying layer 24 on the deep side with respect to the media-opposed surface S as in example 2-1; otherwise the configuration is the same as in comparative example 1-1.

(Evaluation Results)

Evaluation results for the example 2-1 and comparative example 2-1 appear in FIG. 18 and FIG. 19. As shown in FIG. 18 and FIG. 19, in example 2-1, the number of magnetic lines of force linked with the free layer 22e in the depth direction with respect to the media-opposed surface S is reduced compared with the comparative example 2-1, and it is confirmed that inflow into the free layer 22e from the depth direction with respect to the media-opposed surface S of magnetic flux in the bias magnetic field generated by the bias-applying layer 24 is suppressed.

In the above, preferred embodiments of the invention have been explained in detail, but the invention is not limited to the above embodiments. For example, in the first embodiment, the third portion 24c of the bias-applying layer 24 was positioned between the upper magnetic shield layer 23 and the TMR element 22; but other configurations are possible. That is, as shown in FIG. 20, the third portion 24c of the bias-applying layer 24 may be positioned between the lower magnetic shield layer 21 and the TMR element 22. It was confirmed that here also, the inflow into the free layer 22e from the layering direction of magnetic flux in the bias magnetic field generated by the bias-applying layer 24 is suppressed, as shown in FIG. 20 for the read head portion of the thin film magnetic head of a third embodiment. In the third embodiment, the third portion 24c is positioned between the lower magnetic shield layer 21 and the TMR element 22, the thickness $t_1$ in the layering direction of the third portion 24c is set to 5 nm, the distance $t_{10}$ between the upper face of the first portion 24a and the upper face of the second portion 24b is set to 15 nm, and the straight-line distance $t_D$ in the layering direction between the free layer 22e and the third portion 24c is set to 5 nm; otherwise, the configuration is the same as that of example 1-1.

As shown in FIG. 21 and FIG. 22, the third portion 24c of the bias-applying layer 24 may also be positioned both between the upper magnetic shield layer 23 and the TMR element 22, and between the lower magnetic shield layer 21 and the TMR element 22. Here also, as shown in FIG. 21 and FIG. 22 for read head portions of the thin film magnetic heads of a fourth and a fifth embodiment, it was confirmed that the inflow into the free layer 22e from the layering direction of magnetic flux in the bias magnetic field generated by the bias-applying layer 24 is suppressed. In the fourth embodiment (see FIG. 21), the third portion 24c is positioned both between the upper magnetic shield layer 23 and the TMR element 22, and between the lower magnetic shield layer 21 and the TMR element 22; the thickness $t_{1A}$ in the layering direction of the third portion 24c positioned between the upper magnetic shield layer 23 and the TMR element 22 (the third portion 24c on the side of the upper magnetic shield layer 23) was set to 10 nm, the thickness $t_{1B}$ in the layering direction of the third portion 24c positioned between the lower magnetic shield layer 21 and the TMR element 22 (the third portion 24c on the side of the lower magnetic shield layer 21) was set to 5 nm, the straight-line distance $t_C$ in the layering direction between the free layer 22e and the third portion 24c on the side of the upper magnetic shield layer 23 as well as the straight-line distance $t_D$ in the layering direction between the free layer 22e and the third portion 24c on the side of the lower magnetic shield layer 21 were both set to 5 nm; otherwise, the configuration is the same as in example 1-1. And in the fifth embodiment (see FIG. 22), the third portion 24c is positioned both between the upper magnetic shield layer 23 and the TMR element 22, and between the lower magnetic shield layer 21 and the TMR element 22; the thickness $t_{1A}$ in the layering direction of the third portion 24c positioned between the upper magnetic shield layer 23 and the TMR element 22 (the third portion 24c on the side of the upper magnetic shield layer 23) was set to 12.5 nm, the thickness $t_{1B}$ in the layering direction of the third portion 24c positioned between the lower magnetic shield layer 21 and the TMR element 22 (the third portion 24c on the side of the lower magnetic shield layer 21) was set to 7.5 nm, the straight-line distance $t_C$ in the layering direction between the free layer 22e and the third portion 24c on the side of the upper magnetic shield layer 23 as well as the straight-line distance $t_D$ in the layering direction between the free layer 22e and the third portion 24c on the side of the lower magnetic shield layer 21 were both set to 2.5 nm; otherwise, the configuration is the same as in example 1-1.

In the above third through fifth embodiments also, it is preferable that a fourth portion 24d connecting the first portion 24a and the second portion 24b be further provided on the side opposite the media-opposed surface S from the TMR element 22.

It is apparent that various embodiments and modifications of the present invention can be embodied, based on the above description. Accordingly, it is possible to carry out the present invention in modes other than the above best modes, within the following scope of claims and the scope of equivalents thereto.

What is claimed is:

1. A thin film magnetic head having a media-opposed surface, comprising:
a lower magnetic shield layer and an upper magnetic shield layer, mutually opposed in a layering direction;
a magnetoresistance effect element, positioned between said lower magnetic shield layer and said upper magnetic shield layer and positioned on the side of said media-opposed surface, and having a free layer whose magnetization direction changes according to an external magnetic field; and
a bias-applying layer which is positioned between said lower magnetic shield layer and said upper magnetic shield layer, and which applies a bias magnetic field to said magnetoresistance effect element,
wherein
said bias-applying layer has a first portion and a second portion arranged at a distance in a track width direction so as to enclose said magnetoresistance effect element, and a third portion which is placed at least either between said magnetoresistance effect element and said lower magnetic shield layer or between said magnetoresistance effect element and said upper magnetic shield layer, as viewed from said media-opposed surface, and which connects said first portion and said second portion.

2. The thin film magnetic head according to claim 1, wherein the thickness in the layering direction of said third portion of said bias-applying layer is 2 nm or greater, and is less than one-half the straight-line distance in the layering direction between said lower magnetic shield layer and said upper magnetic shield layer, and moreover is smaller than the magnitude of the thickness, in the layering direction, of said first portion and said second portion, obtained by subtracting the straight-line distance in the layering direction between said free layer and said third portion, and the thickness in the layering direction of said free layer.

3. The thin film magnetic head according to claim 1, wherein said free layer is positioned on a virtual plane passing substantially through the center in the layering direction of said first portion and said second portion of said bias-applying layer.

4. The thin film magnetic head according to claim 1, wherein said free layer is positioned substantially in the center in the layering direction between said lower magnetic shield layer and said upper magnetic shield layer.

5. The thin film magnetic head according to claim 1, wherein said third portion is positioned both between said magnetoresistance effect element and said lower magnetic shield layer, and between said magnetoresistance effect element and said upper magnetic shield layer.

6. The thin film magnetic head according to claim 1, wherein said bias-applying layer further comprises a fourth portion which positioned on a side opposite said media-opposed surface from said magnetoresistance effect element, and which connects said first portion and said second portion.

7. The thin film magnetic head according to claim 1, wherein a sense current flows in said magnetoresistance effect element in a film thickness direction of said free layer.

8. The thin film magnetic head according to claim 1, wherein the third portion is over and in contact with the magnetoresistance effect element when placed between said magnetoresistance effect element and said upper magnetic shield layer, and is under and in contact with the magnetoresistance effect element when placed between said magnetoresistance effect element and said lower magnetic shield layer, as viewed from the media opposed surface.

* * * * *